United States Patent
Lin et al.

(10) Patent No.: US 11,152,568 B2
(45) Date of Patent: Oct. 19, 2021

(54) TOP-ELECTRODE BARRIER LAYER FOR RRAM

(71) Applicant: Taiwan Semiconductor Manufacturing Co., Ltd., Hsin-Chu (TW)

(72) Inventors: Hsing-Lien Lin, Hsin-Chu (TW); Chii-Ming Wu, Taipei (TW); Fa-Shen Jiang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/724,673

(22) Filed: Dec. 23, 2019

(65) Prior Publication Data

US 2020/0411758 A1  Dec. 31, 2020

Related U.S. Application Data

(60) Provisional application No. 62/867,408, filed on Jun. 27, 2019.

(51) Int. Cl.
  *H01L 45/00* (2006.01)
  *H01L 27/24* (2006.01)
(52) U.S. Cl.
  CPC ...... *H01L 45/1253* (2013.01); *H01L 27/2436* (2013.01); *H01L 27/2463* (2013.01); *H01L 45/085* (2013.01); *H01L 45/1233* (2013.01); *H01L 45/1683* (2013.01)

(58) Field of Classification Search
  None
  See application file for complete search history.

(56) References Cited

U.S. PATENT DOCUMENTS

| | | | |
|---|---|---|---|
| 9,595,670 B1 * | 3/2017 | Gee | H01L 45/146 |
| 9,997,569 B2 * | 6/2018 | Yamaguchi | H01L 45/08 |
| 2005/0093091 A1 * | 5/2005 | Badami | H01L 23/5258 257/529 |

(Continued)

OTHER PUBLICATIONS

Liu, Qi, et al. "Real-Time Observation on Dynamic Growth/Dissolution of Conductive Filaments in Oxide-Electrolyte-Based ReRAM." Advanced Materials, vol. 24, No. 14, 2012, pp. 1844-1849., doi:10.1002/adma.201104104. (Year: 2012).*

(Continued)

*Primary Examiner* — J. E. Schoenholtz
(74) *Attorney, Agent, or Firm* — Eschweiler & Potashnik, LLC

(57) ABSTRACT

Various embodiments of the present application are directed towards a resistive random-access memory (RRAM) cell including a top-electrode barrier layer configured to block the movement of nitrogen or some other suitable non-metal element from a top electrode of the RRAM cell to an active metal layer of the RRAM cell. Blocking the movement of non-metal element may be prevent formation of an undesired switching layer between the active metal layer and the top electrode. The undesired switching layer would increase parasitic resistance of the RRAM cell, such that top-electrode barrier layer may reduce parasitic resistance by preventing formation of the undesired switching layer.

20 Claims, 12 Drawing Sheets

(56) References Cited

U.S. PATENT DOCUMENTS

| | | | |
|---|---|---|---|
| 2007/0123042 A1* | 5/2007 | Rim | H01L 21/28518 438/683 |
| 2014/0008603 A1* | 1/2014 | Takahashi | H01L 45/14 257/4 |
| 2014/0175360 A1* | 6/2014 | Tendulkar | H01L 45/08 257/4 |
| 2014/0192589 A1* | 7/2014 | Maxwell | H01L 45/1233 365/148 |
| 2015/0144859 A1 | 5/2015 | Chen et al. | |
| 2016/0380193 A1* | 12/2016 | Chen | H01L 45/1683 257/4 |
| 2019/0115530 A1 | 4/2019 | Trinh et al. | |
| 2019/0157553 A1 | 5/2019 | Trinh et al. | |
| 2019/0165266 A1 | 5/2019 | Trinh et al. | |

OTHER PUBLICATIONS

Zahoor, Furqan, et al. "Resistive Random Access Memory (RRAM): an Overview of Materials, Switching Mechanism, Performance, Multilevel Cell (Mlc) Storage, Modeling, and Applications." Nanoscale Research Letters, vol. 15, No. 1, 2020, doi:10.1186/s11671-020-03299-9. (Year: 2020).*

Kim, Taeyoon, et al. "Exploring Oxygen-Affinity-Controlled TaN Electrodes for Thermally Advanced TaOx Bipolar Resistive Switching." Scientific Reports, vol. 8, No. 1, 2018, doi:10.1038/s41598-018-26997-y. (Year: 2018).*

Elers, Kai-Erik. "Copper Diffusion Barrier Deposition on Integrated Circuit Devices by Atomic Layer Deposition Technique." University of Helsinki, published on Nov. 18, 2018.

Chen et al. "Endurance/Retention Trade-off on HfO2/Metal Cap 1T1R Bipolar RRAM." IEEE Transactions on Electron Devices, vol. 60, No. 3, Mar. 2013.

* cited by examiner

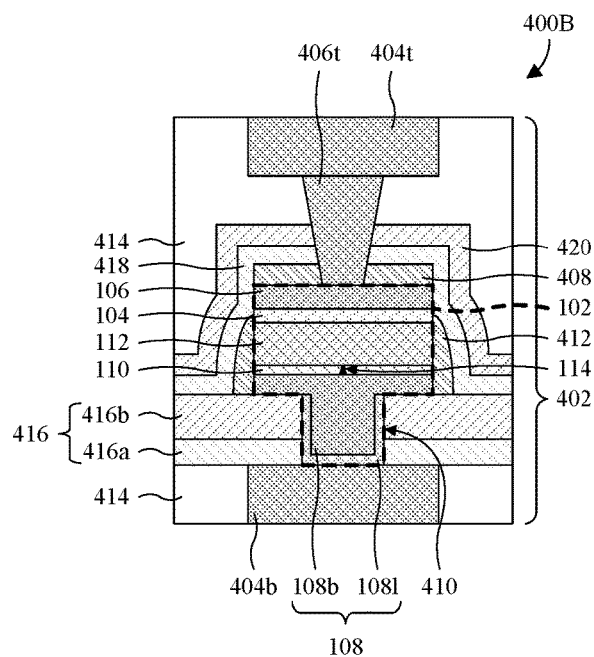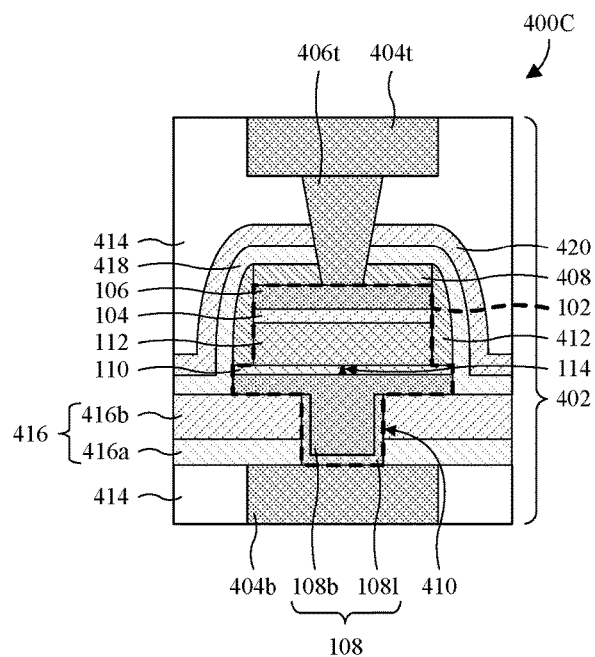
Fig. 4B        Fig. 4C
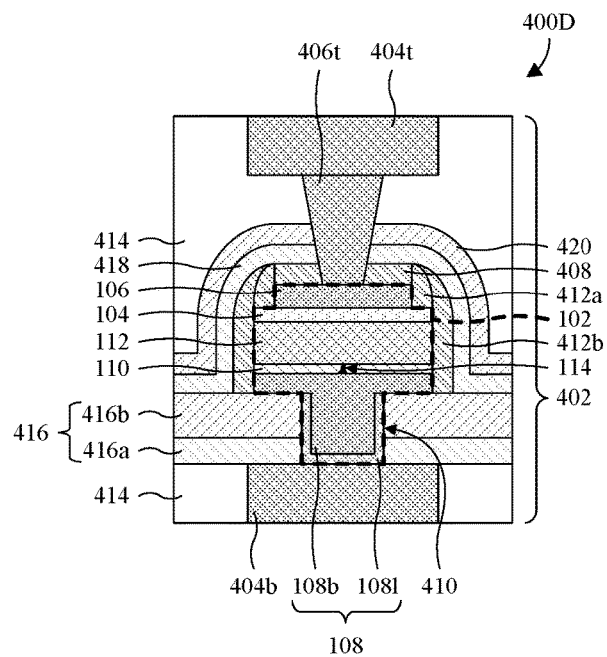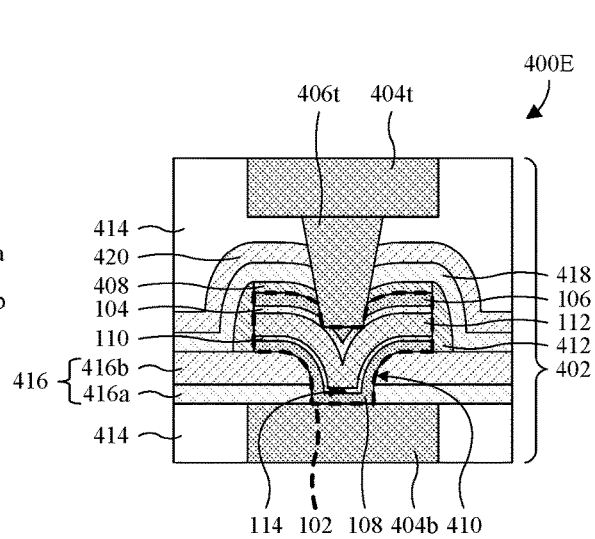
Fig. 4D        Fig. 4E

TOP-ELECTRODE BARRIER LAYER FOR RRAM

REFERENCE TO RELATED APPLICATION

This application claims the benefit of U.S. Provisional Application No. 62/867,408, filed on Jun. 27, 2019, the contents of which are incorporated by reference in their entirety.

BACKGROUND

Many modern-day electronic devices include non-volatile memory. Non-volatile memory is electronic memory that is able to store data in the absence of power. Some promising candidates for the next generation of non-volatile memory include resistive random-access memory (RRAM). RRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4G illustrate cross-sectional views of various embodiments of the RRAM cell of FIG. 1 in which the RRAM cell is in an interconnect structure of an integrated circuit chip.

DETAILED DESCRIPTION

Figure 1:
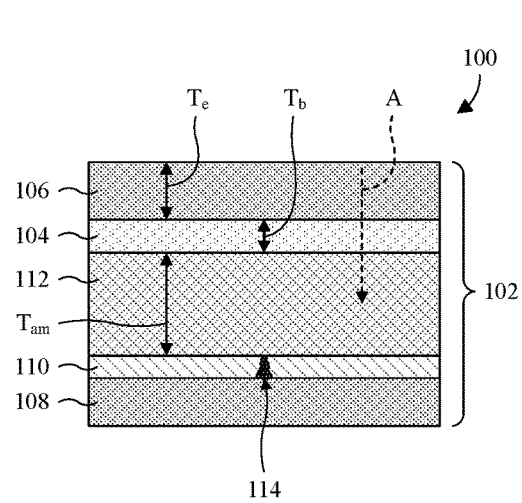
FIG. 1 illustrates a cross-sectional view of some embodiments of a resistive random-access memory (RRAM) cell comprising a top-electrode barrier layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a resistive random-access memory (RRAM) cell comprises a bottom electrode, a switching layer overlying the bottom electrode, an active metal layer overlying the switching layer, and a top electrode layer overlying the active metal layer. During operation of the RRAM cell, the RRAM cell is alternatingly set to a low resistance state (LRS) and reset to a high resistance state (HRS). To set the RRAM cell, a set voltage with a positive polarity is applied from the top electrode to the bottom electrode. The set voltage induces oxidation of the active metal layer and forms metal cations. Further, an electric field from the set voltage causes the metal cations to migrate towards the bottom electrode and to reduce into a metal filament in the switching layer. Forming the metal filament changes the switching layer and hence the RRAM cell to a LRS. To reset the RRAM cell, a reset voltage with a negative polarity is applied from the top electrode to the bottom electrode. The reset voltage reverses the process by which the metal filament forms and hence dissolves the metal filament. Dissolving the metal filament changes the switching layer and hence the RRAM cell to a HRS.

In some embodiments, the top electrode is or comprises a metal nitride. Using a metal nitride for the top electrode is less expensive than platinum, ruthenium, or some other noble metal. However, nitrogen gas used during formation of the top electrode and/or nitrogen in the top electrode may diffuse into the active metal layer and form an undesired switching layer between the top electrode and the active metal layer. The undesired switching layer changes between a HRS and a LRS in the same way described above for the switching layer, except that a metal filament of the undesired switching layer extends to the active metal layer from the top electrode and polarities for switching between the HRS and the LRS are reversed. Because the polarities are reversed, the undesired switching layer is in the HRS when the switching layer is in the LRS and vice versa. This has the effect of increasing overall resistance of the RRAM cell, especially while in the LRS. Because of the increased resistance, operating parameters of the RRAM cell may be shifted out of specification and/or a switching window of the RRAM cell (i.e., a difference between resistances of the RRAM cell in a LRS and a HRS) may be decreased. This may, in turn, reduce manufacturing yields and/or reliability of the RRAM cell.

Various embodiments of the present application are directed towards an RRAM cell comprising a top-electrode barrier layer. In some embodiments, the RRAM cell comprises a bottom electrode, a switching layer over the bottom electrode, an active metal layer over the switching layer, the top-electrode barrier layer over the active metal layer, and a top electrode over the top-electrode barrier layer. The top and bottom electrodes each has a lower reactivity to oxygen than the active metal layer and each comprises a metal element. Further, the top electrode comprises nitrogen or some other suitable non-metal element. The top-electrode barrier layer is conductive and is configured to block or otherwise reduce diffusion of the non-metal element from the top electrode to the active metal layer.

In at least embodiments in which the top electrode is or comprises a metal nitride and the non-metal element is nitrogen, arranging the top-electrode barrier layer between the top electrode and the active metal layer reduces parasitic resistance at the top electrode. For example, without the top-electrode barrier layer, the nitrogen may diffuse into the active metal layer and create an undesired switching layer. This undesired switching layer may change to a HRS while the switching layer changes to a LRS and vice versa, whereby the undesired switching layer may lead to parasitic resistance. By reducing the parasitic resistance at the top electrode, a switching window of the RRAM cell may be enlarged, reliability of the RRAM cell may be improved, and manufacturing yields may be higher. In some embodiments, the top-electrode barrier layer reduces the parasitic resistance of the RRAM cell while in the LRS from about 15 kiloohms to about 30 ohms. Other suitable resistance values are, however, amenable.

With reference to FIG. 1, a cross-sectional view 100 of some embodiments of an RRAM cell 102 comprising a top-electrode barrier layer 104 is provided. As above, the top-electrode barrier layer 104 blocks or otherwise reduces diffusion of nitrogen or some other suitable non-metal element in a top electrode 106 to reduce parasitic resistance at the top electrode 106. The RRAM cell 102 may, for example, be integrated with other devices in an integrated circuit (IC) chip and/or may, for example, be a cation-type RRAM cell or some other suitable type of RRAM cell. Note that cation-type RRAM cells are sometimes referred to as programmable metallization cells (PMCs) or conductive-bridging random-access memory (CBRAM) cells.

A bottom electrode 108, a switching layer 110, and an active metal layer 112 are stacked with the top-electrode barrier layer 104 and the top electrode 106 to define the RRAM cell 102. The switching layer 110 overlies the bottom electrode 108, the active metal layer 112 overlies the switching layer 110, the top-electrode barrier layer 104 overlies the active metal layer 112, and the top electrode 106 overlies the top-electrode barrier layer 104. During operation of the RRAM cell 102, a metal filament 114 is repeatedly formed and dissolved in the switching layer 110 to change the RRAM cell 102 between a LRS and a HRS. While forming the metal filament 114, a set voltage with a positive polarity is applied from the top electrode 106 to the bottom electrode 108. The set voltage induces oxidation of the active metal layer 112 and forms metal cations. Further, an electric field from the set voltage causes the metal cations to migrate to the switching layer 110 and to reduce into the metal filament 114. While dissolving the metal filament 114, a reset voltage with a negative polarity is applied from the top electrode 106 to the bottom electrode 108. The reset voltage induces oxidation of the metal filament 114 and forms metal cations. Further, an electric field from the reset voltage causes the metal cations to migrate to the active metal layer 112 and to reduce into the active metal layer 112.

The top and bottom electrodes 106, 108 and the active metal layer 112 are conductive. However, the active metal layer 112 is electrochemically active compared to the top and bottom electrodes 106, 108. Hence, the top and bottom electrodes 106, 108 have lower reactivities with oxygen than the active metal layer 112 and depend upon more energy to oxidize than the active metal layer 112. For example, the top and bottom electrodes 106, 108 may depend upon 5 or more electron volts (eV) to oxidize, whereas the active metal layer 112 may depend upon 3 or less eV to oxidize. Other eV values are, however, amenable. The top electrode 106 and/or the bottom electrode 108 may, for example, be or comprise titanium nitride, tantalum nitride, tungsten nitride, some other suitable metal nitride(s), some other suitable material(s), or any combination of the foregoing. The active metal layer 112 may, for example, be or comprise aluminum, copper, silver, nickel, some other suitable metal(s), or any combination of the foregoing.

The top electrode 106 comprises a metal element and a non-metal element. In some but not all embodiments, the top electrode 106 consists of or consist essentially of the metal element and the non-metal element. The non-metal element reduces locations at which oxygen may bond to the metal element and hence reduces oxygen reactivity. As a result, the top electrode 106 may be formed without using platinum, ruthenium, and other expensive noble metals. In some embodiments, a ratio of atoms of the metal element to atoms of the non-metal element is between about 1:1 and 1:1.1 to saturate or substantially saturate locations at which oxygen may bond to the metal element. In some embodiments, an atomic percentage of the metal element is about 50% and/or an atomic percentage of the non-metal element is about 50%. The metal element may, for example, be titanium, tungsten, tantalum, or some other suitable element, and/or the non-metal element may, for example, be nitrogen or some other suitable element.

While the non-metal element lowers oxygen reactivity and allows the top electrode 106 to be formed at less expense, the non-metal element may result in parasitic resistance if not for the top-electrode barrier layer 104. The top-electrode barrier layer 104 blocks or otherwise slows diffusion of the non-metal element into the active metal layer 112 and may, for example, be exposed to the non-metal element by gas used to form the top electrode 106 and/or by the top electrode 106. In at least embodiments in which the non-metal element is nitrogen and the active metal layer 112 is aluminum, the nitrogen would create an undesired switching layer between the active metal layer 112 and the top electrode 106 if allowed to diffuse into the active metal layer 112. The undesired switching layer would change to a HRS while the switching layer 110 changes to a LRS and vice versa, whereby the undesired switching layer would lead to parasitic resistance. Because the undesired switching layer would be in a HRS while the switching layer 110 is in a LRS, the parasitic resistance would be more pronounced at while the switching layer 110 and hence the RRAM cell 102 are in the LRS. Accordingly, the top-electrode barrier layer 104 may reduce parasitic resistance by blocking or otherwise slowing diffusion of the non-metal element into the active metal layer 112. By reducing the parasitic resistance, a switching window of the RRAM cell 102 may be enlarged, reliability of the RRAM cell 102 may be improved, and manufacturing yields for the RRAM cell 102 may be higher.

In some embodiments, the bottom electrode 108 is or comprises ruthenium, platinum, some other suitable noble metal(s), or any combination of the foregoing. In some embodiments, the bottom electrode 108 comprises a metal element and a non-metal element. In some but not all embodiments, the bottom electrode 108 consists of or consist essentially of the metal element and the non-metal element. The non-metal element of the bottom electrode 108 may reduce locations at which oxygen may bond to the metal element to reduce oxygen reactivity and manufacturing expense for the bottom electrode 108. In some embodiments, the bottom electrode 108 has a same material composition as the top electrode 106. In some embodiments, the metal element of the bottom electrode 108 is the same as that of the top electrode 106 and/or the non-metal element of the bottom electrode 108 is the same as that of the top electrode 106.

The metal element of the top electrode 106 and/or the metal element of the bottom electrode 108 may, for example, be or comprise titanium, tantalum, tungsten, or some other suitable metal. The non-metal element of the top electrode 106 and/or the non-metal element of the bottom electrode 108 may, for example, be nitrogen or some other suitable element. In some embodiments, the metal element of the top electrode 106 has a greater reactivity with oxygen than the active metal layer 112, but the non-metal element of the top electrode 106 reduces the oxygen reactivity of the top electrode 106 to less than that of the active metal layer 112.

In some embodiments, the top and bottom electrodes 106, 108 have individual electrode thicknesses $T_e$ that are about 150-250 angstroms, about 150-200 angstroms, about 200-250 angstroms, or about 200 angstroms. Other thicknesses are, however, amenable. In some embodiments, the active metal layer 112 has an active-metal thickness $T_{am}$ that is about 10-500 angstroms, about 10-255 angstroms, about 255-500 angstroms, or about 400 angstroms. Other thicknesses are, however, amenable. If the active metal layer 112 is too thin (e.g., less than about 10 angstroms or some other suitable value), the active metal layer 112 may be unable to sufficiently source metal to the switching layer 110. If the active metal layer 112 is too thick (e.g., greater than about 500 angstroms or some other suitable value), voltage drops across the active metal layer 112 may be high and hence reliability may be poor. Additionally, or alternatively, if the active metal layer 112 is too thick (e.g., greater than about 500 angstroms or some other suitable value), the active metal layer 112 may make integration with existing processes more difficult.

The switching layer 110 is a solid electrolyte for metal cations that result from oxidation of the active metal layer 112. For example, where the active metal layer 112 is or comprises aluminum, the switching layer 110 may be a solid electrolyte for aluminum cations. In some embodiments, the switching layer 110 is or comprises silicon oxide (e.g., SiO2), hafnium oxide (e.g., HfO2), silicon nitride (e.g., SiNx), aluminum oxide (e.g., Al2O3), zirconium oxide (e.g., ZrO2), some other suitable dielectric(s), or any combination of the foregoing. Further, in some embodiments, the switching layer 110 is or comprises germanium sulfur (e.g., GeS), germanium selenium (e.g., GeSe), germanium tellurium (e.g., GeTe), a metal oxide, amorphous silicon, some other suitable electrolyte(s), or any combination of the foregoing.

The top-electrode barrier layer 104 is conductive and, as described above, is configured to block or otherwise slow the non-metal element of the top electrode 106 from diffusing to the active metal layer 112. In some embodiments, the top-electrode barrier layer 104 is or comprises titanium, tantalum, tungsten, some other suitable barrier material(s), or any combination of the foregoing. In some embodiments, the top-electrode barrier layer 104 has an amorphous structure so as to eliminate grain boundaries and to increase diffusion-path complexity for the non-metal element of the top electrode 106. Alternatively, in some embodiments, the top-electrode barrier layer 104 has a nanocrystalline structure and metal grains of the top-electrode barrier layer 104 are equiaxed grains, instead of columnar grains, so as to increase diffusion-path complexity for the non-metal element of the top electrode 106. By increasing diffusion-path complexity for the non-metal element of the top electrode 106, diffusion of the non-metal element through the top-electrode barrier layer 104 is slowed or otherwise stopped.

In some embodiments, the top-electrode barrier layer 104 is or comprises the metal element of the top electrode 106 and/or the metal element of the bottom electrode 108. In some but not all embodiments, the top-electrode barrier layer 104 consists of or consists essentially of a single metal element, such as, for example, the metal element of the top electrode 106, the metal element of the bottom electrode 108, or some other suitable metal element. In some embodiments, a combined resistance of the top-electrode barrier layer 104 and the top electrode 106, from a top surface of the top electrode 106 to a bottom surface of the top-electrode barrier layer 104, is about 30 ohms, less than about 1000 ohms, about 10-100 ohms, or some other suitable value.

In some embodiments, the top-electrode barrier layer 104 has a barrier thickness $T_b$ of about 50-100 angstroms, about 50-75 angstroms, about 75-100 angstroms, or about 50 angstroms. Other thicknesses are, however, amenable. If the top-electrode barrier layer 104 is too thin (e.g., less than about 50 angstroms or some other suitable value), the top-electrode barrier layer 104 may be unable to block or otherwise slow migration of the non-metal element of the top electrode 106 through the top-electrode barrier layer 104 and may hence be unable to reduce parasitic resistance at the top electrode 106. On the other hand, if the top-electrode barrier layer 104 is too thick (e.g., more than about 100 angstroms or some other suitable value), the top-electrode barrier layer 104 may introduce too much resistance into the RRAM cell 102 and shift operating parameters of the RRAM cell 102 out of specification. Additionally, or alternatively, if the top-electrode barrier layer 104 is too thick (e.g., more than about 100 angstrom or some other suitable value), the top-electrode barrier layer 104 may make integration with existing manufacturing processes more difficult. In some embodiments, a ratio of the barrier thickness $T_b$ to the electrode thicknesses $T_e$ of the top electrode 106 is about 1:2-4 or some other suitable ratio. In some embodiments, a sum of the barrier thickness $T_b$ and the electrode thicknesses $T_e$ of the top electrode 106 is less than about 250 angstroms, about 200-300 angstroms, or some other suitable value.

Figure 2:
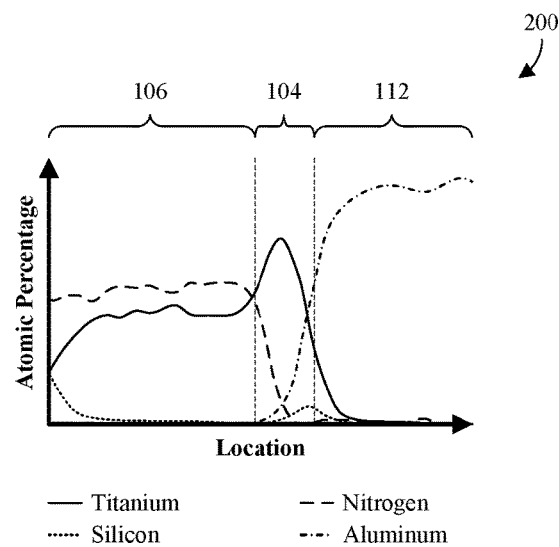
FIG. 2 illustrates a graph describing atomic percentages as a function of location for various materials in some embodiments of the RRAM cell of FIG. 1.

With reference to FIG. 2, a graph 200 describing atomic percentages as a function of location for various materials in some embodiments of the RRAM cell 102 of FIG. 1 is provided. Location corresponds to vertical distance from a top surface of the top electrode 106 and may, for example, be taken along line A in FIG. 1. As seen, the top electrode 106 is made up of mostly titanium and nitrogen, the active metal layer 112 is made up of mostly aluminum, and the top-electrode barrier layer 104 is made up of mostly titanium. Further, an atomic percentage of nitrogen drops to about zero while transitioning from the top electrode 106 to the top-electrode barrier layer 104. As such, the top-electrode barrier layer 104 is devoid of or substantially devoid of nitrogen along a bottom of the top-electrode barrier layer 104. Notwithstanding the specific elements and ratios of atomic percentages illustrated by the graph 200, it is to be understood that other elements and/or ratios of atomic percentages are amenable in alternative embodiments.

Figure 3:
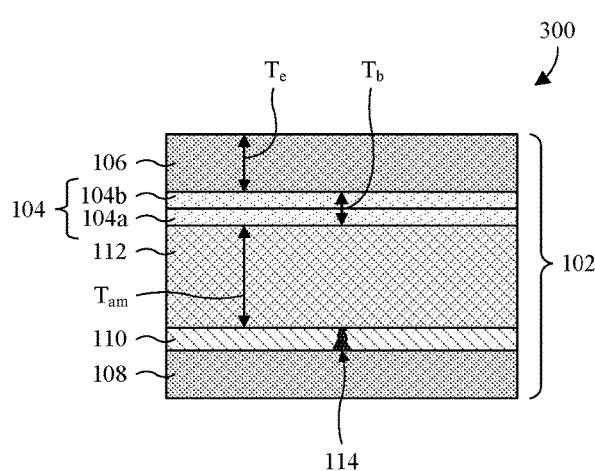
FIG. 3 illustrates a cross-sectional view of some alternative embodiments of the RRAM cell of FIG. 1 in which the top-electrode barrier layer is a multilayer film.

With reference to FIG. 3, a cross-sectional view 300 of some alternative embodiments of the RRAM cell 102 of FIG. 1 is provided in which the top-electrode barrier layer 104 is a multilayer film. The top-electrode barrier layer 104 comprises a first top-electrode barrier layer 104a and further comprises a second top-electrode barrier layer 104b overlying the first top-electrode barrier layer 104a. The first and second top-electrode barrier layers 104a, 104b are each as the top-electrode barrier layer 104 is described with regard to FIG. 1 but each is or comprises a different material. For example, the first top-electrode barrier layer 104a may be or comprise tantalum, and the second top-electrode barrier layer 104b may be or comprise titanium, or vice versa. Other materials are, however, amenable.

In some embodiments, the first and second top-electrode barrier layers 104a, 104b have nanocrystalline structures. In such embodiments, because the first and second top-electrode barrier layers 104a, 104b are different materials, metal grains of the first top-electrode barrier layer 104a are not aligned with metal grains of the second top-electrode barrier layer 104b. As such, diffusion-path complexity for the non-metal element of the top electrode 106 is increased. By increasing the diffusion-path complexity, diffusion of the non-metal element through the top-electrode barrier layer 104 is slowed or otherwise stopped.

While FIG. 3 illustrates the RRAM cell 102 as having two individual top-electrode barrier layers 104a, 104b, more individual top-electrode barrier layers are amenable in alternative embodiments. For example, a third top-electrode barrier layer may be vertically between and directly contact the second top-electrode barrier layer 104b and the top electrode 106. In this example, the third top-electrode barrier layer may be a different material than the first and second top-electrode barrier layers 104a, 104b or may be or comprise, for example, the same material as the first top-electrode barrier layer 104a. As another example, the first and second top-electrode barrier layers 104a, 104b may alternatingly repeat, such that the RRAM cell 102 alternates between a material of the first top-electrode barrier layer 104a and a material of the second top-electrode barrier layer 104b multiple times from the top electrode 106 to the active metal layer 112. In this example, the first top-electrode barrier layer 104a may repeat 2, 3, 4, or more times with the second top-electrode barrier layer 104b.

Figure 4A:
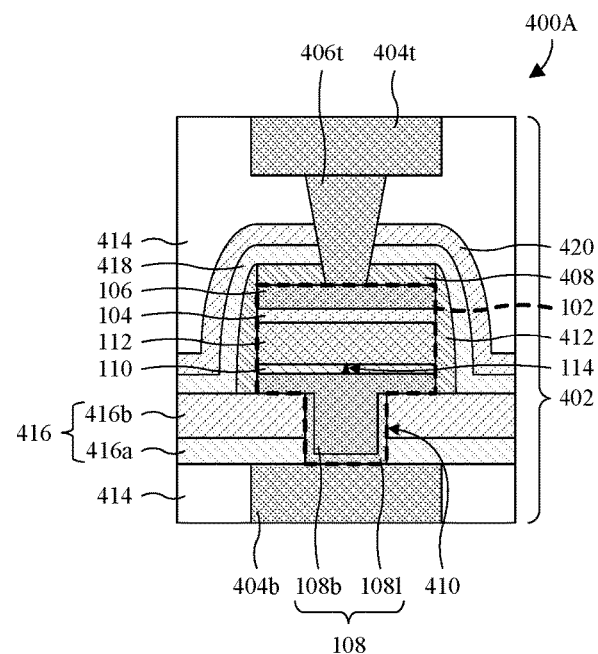

With reference to FIG. 4A, a cross-sectional view 400A of some embodiments of the RRAM cell 102 of FIG. 1 is provided in which the RRAM cell 102 is in an interconnect structure 402 of an integrated circuit chip and the bottom electrode 108 of the RRAM cell 102 has a T-shaped profile. The RRAM cell 102 underlies a top-electrode wire 404t and a top-electrode via 406t and further overlies a bottom-electrode wire 404b.

The top-electrode via 406t extends downward from the top-electrode wire 404t to the top electrode 106. In some embodiments (as illustrated), the top-electrode via 406t extends through a hard mask 408 atop the top electrode 106. In alternative embodiments, the hard mask 408 is omitted. The hard mask 408 may be or comprise, for example, silicon nitride and/or some other suitable dielectric(s). The top-electrode wire 404t, the bottom-electrode wire 404b, and the top-electrode via 406t may be or comprise, for example, copper, aluminum copper, some other suitable metal(s), or any combination of the foregoing.

The bottom electrode 108 protrudes downward to the bottom-electrode wire 404b, thereby defining a bottom-electrode via 410 electrically coupling the bottom electrode 108 to the bottom-electrode wire 404b. The bottom electrode 108 comprises a bottom-electrode body 108b and a bottom-electrode liner 108l cupping an underside of the bottom-electrode body 108b. In some embodiments, the bottom-electrode liner 108l is an adhesion layer to enhance deposition of a layer from which the bottom-electrode body 108b is formed. Further, in some embodiments, the bottom-electrode liner 108l is a diffusion barrier to prevent material of the bottom-electrode wire 404b from diffusing to the bottom-electrode body 108b. The bottom-electrode liner 108l may be or comprise, for example, tantalum nitride and/or some other suitable conductive barrier material(s). The bottom-electrode body 108b may be or comprise, for example, titanium nitride and/or some other suitable conductive material(s).

In alternative embodiments, the bottom-electrode liner 108l is omitted. In such alternative embodiments, the bottom electrode 108 may be a single conductive material throughout an entirety of the bottom electrode 108. For example, the bottom electrode 108 may be or comprise tantalum nitride, titanium nitride, some other suitable conductive material(s), or any combination of the foregoing. Forming the bottom electrode 108 of a single conductive material improves flatness along a top surface of the bottom electrode 108 when the bottom electrode 108 is formed using a chemical mechanical polish (CMP) or some other suitable planarization since the bottom electrode 108 has a single hardness throughout and hence a single removal rate throughout. This, in turn, improves electric field uniformity across the RRAM cell 102.

A dielectric structure surrounds the RRAM cell 102, as well as the top-electrode wire 404t, the top-electrode via 406t, and the bottom-electrode wire 404b. The dielectric structure comprises the hard mask 408 along a top surface of the top electrode 106 and further comprises a sidewall spacer structure 412 on sidewall(s) of the RRAM cell 102. The sidewall spacer structure 412 comprises a pair of segments respectively on opposite sides of the RRAM cell 102 and may be or comprise, for example, silicon nitride and/or some other suitable dielectric(s). Additionally, the dielectric structure comprises a plurality of intermetal dielectric (IMD) layers 414, a via dielectric layer 416, an etch stop layer 418, and an IMD liner 420.

The IMD layers 414 respectively surround the bottom-electrode wire 404b and the top-electrode wire 404t. The IMD layers 414 may be or comprise, for example, an extreme low k dielectric and/or some other suitable dielectric(s). The via dielectric layer 416, the etch stop layer 418, and the IMD liner 420 are stacked between the IMD layers 414.

The via dielectric layer 416 surrounds the bottom-electrode via 410, between the RRAM cell 102 and the bottom-electrode wire 404b. In some embodiments, the via dielectric layer 416 is a multilayer film comprising a lower via dielectric layer 416a and an upper via dielectric layer 416b overlying the lower via dielectric layer 416a. The lower and upper via dielectric layers 416a, 416b are different materials and may, for example, respectively be or comprise silicon carbide and silicon-rich oxide. Other materials are, however, amenable. In alternative embodiments, the via dielectric layer 416 is a single layer.

The etch stop layer 418 covers the via dielectric layer 416 and wraps around a top of the RRAM cell 102. Further, the IMD liner 420 covers and lines the etch stop layer 418 so as to separate the etch stop layer 418 from a neighboring one of the IMD layers 414. The IMD liner 420 may be or comprise, for example, tetraethyl orthosilicate (TEOS) oxide and/or some other suitable dielectric(s). The etch stop layer 418 may be or comprise, for example, silicon carbide and/or some other suitable dielectric(s).

With reference to FIG. 4B, a cross-sectional view 400B of some alternative embodiments of the RRAM cell 102 of FIG. 4A is provided in which a top edge of the sidewall spacer structure 412 is level with the top-electrode barrier layer 104. As such, the etch stop layer 418 contacts a sidewall of the top-electrode barrier layer 104. In alternative embodiments, the top edge of the sidewall spacer structure 412 is level with the top electrode 106.

With reference to FIG. 4C, a cross-sectional view 400C of some alternative embodiments of the RRAM cell 102 of FIG. 4A is provided in which the sidewall spacer structure 412 overlies the switching layer 110. Further, the sidewall spacer structure 412 lines sidewalls respectively of the active metal layer 112, the top-electrode barrier layer 104, and the top electrode 106, but not sidewalls respectively of the switching layer 110 and the bottom electrode 108.

With reference to FIG. 4D, a cross-sectional view 400D of some alternative embodiments of the RRAM cell 102 of FIG. 4A is provided in which the sidewall spacer structure 412 is replaced with a first sidewall spacer structure 412a and a second sidewall spacer structure 412b. The first sidewall spacer structure 412a overlies the top-electrode barrier layer 104 and lines sidewalls respectively of the top electrode 106 and the hard mask 408. As a result, sidewalls respectively of the top electrode 106 and the hard mask 408 are offset from sidewall(s) of the top-electrode barrier layer 104. The second sidewall spacer structure 412b lines sidewalls respectively of the first sidewall spacer structure 412a, the top-electrode barrier layer 104, the active metal layer 112, the switching layer 110, and the bottom electrode 108. In alternative embodiments, the second sidewall spacer structure 412b overlies the switching layer 110 in the same manner as the sidewall spacer structure 412 of FIG. 4C. The first sidewall spacer structure 412a and/or the second sidewall spacer structure 412b may be or comprise, for example, silicon nitride and/or some other suitable dielectric(s).

With reference to FIG. 4E, a cross-sectional view 400E of some alternative embodiments of the RRAM cell 102 of FIG. 4A is provided in which a top of the RRAM cell 102 is indented at the bottom-electrode via 410. Further, the RRAM cell 102 is without the bottom-electrode liner 108l (see FIG. 4A) and top corners of the via dielectric layer 416 at the bottom-electrode via 410 are rounded or otherwise curved. In alternative embodiments, the RRAM cell 102 further includes the bottom-electrode liner 108l as in FIG. 4A and/or the top corners of the via dielectric layer 416 are as in FIG. 4A With reference to FIG. 4F, a cross-sectional view 400F of some alternative embodiments of the RRAM cell 102 of FIG. 4A is provided in which the bottom-electrode via 410 is omitted. Further, the top and bottom electrodes 106, 108, the top-electrode barrier layer 104, the switching layer 110, and the active metal layer 112 have U-shaped profiles and several features in FIG. 4A are omitted. Amongst these omitted features are the sidewall spacer structure 412, the hard mask 408, the etch stop layer 418, and the IMD liner 420. As seen hereafter, the RRAM cell 102 may be formed with a single photolithography/etching process, thereby reducing costs.

Figure 4F:
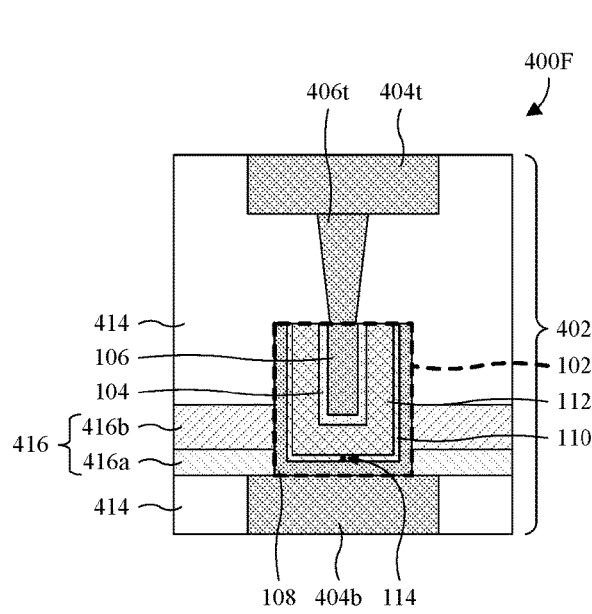
Figure 4G:
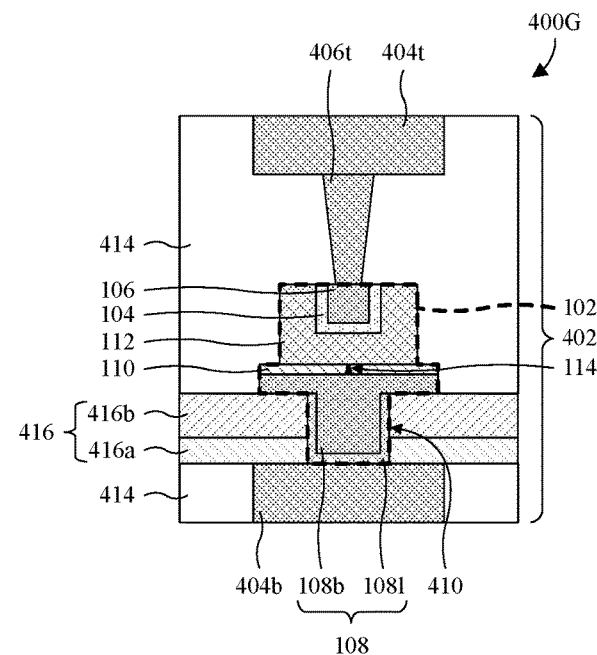

With reference to FIG. 4G, a cross-sectional view 400G of some alternative embodiments of the RRAM cell 102 of FIG. 4A is provided in which the top electrodes 106, the top-electrode barrier layer 104, and the active metal layer 112 have U-shaped profiles and several features in FIG. 4A are omitted. Amongst these omitted features are the sidewall spacer structure 412, the hard mask 408, the etch stop layer 418, and the IMD liner 420.

While FIGS. 4A-4G are illustrated using embodiments of the RRAM cell 102 in FIG. 1, embodiments of the RRAM cell 102 in FIG. 3 may alternatively be used. That is to say, the top-electrode barrier layer 104 of FIGS. 4A-4G may be a multilayer film as illustrated and/or described with regard to FIG. 3. While the sidewall spacer structures 412 in FIGS. 4B, 4D, and 4E are illustrated along sidewalls of the bottom electrode 108 and the switching layer 110, the sidewall spacer structures 412 may alternatively overlie the bottom electrode 108 and the switching layer 110 as in FIG. 4C. While FIGS. 4F and 4G are illustrated without the etch stop layer 418 and the IMD liner 420, the etch stop layer 418 and/or the IMD liner 420 may alternatively be present. While FIGS. 4F and 4G illustrate various layers making up the RRAM cell 102 as having U-shaped profiles, the various layers may alternatively have V-shaped profiles or some other suitable profiles.

Figure 5A:
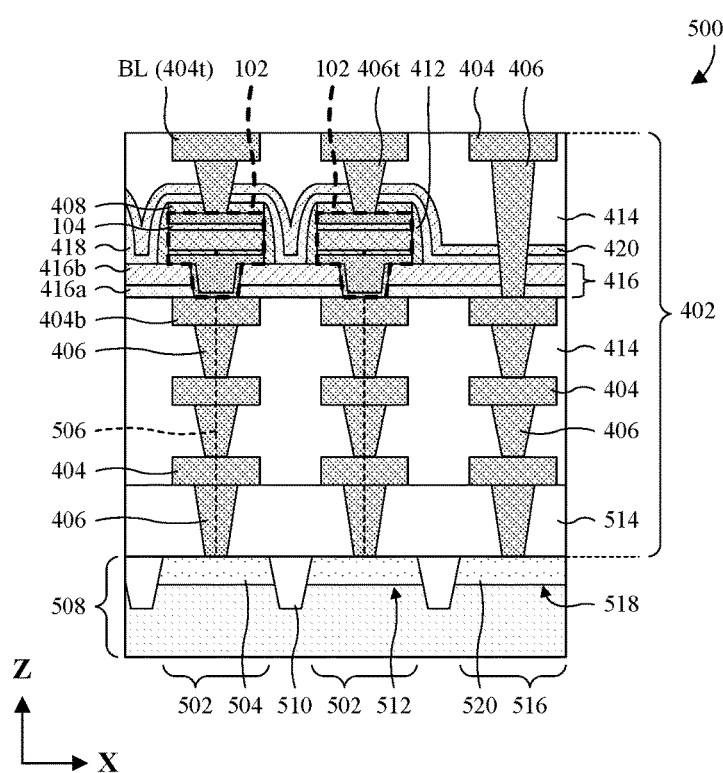
FIGS. 5A and 5B illustrate cross-sectional views of some embodiments of an integrated circuit chip in which RRAM cells are integrated with individual one-transistor one-resistor (1T1R) cells and comprise individual top-electrode barrier layers.

With reference to FIG. 5A, a cross-sectional view 500A of some embodiments of RRAM cells 102 is provided in which the RRAM cells 102 comprise individual top-electrode barrier layers 104 and are integrated with individual one-transistor one-resistor (1T1R) cells 502 in an integrated circuit chip. The RRAM cells 102 of FIG. 5A are each as the RRAM cell 102 of FIG. 4A is illustrated and described. The 1T1R cells 502 comprise individual drain regions 504 and individual drain-side conductive paths 506.

The drain regions 504 are doped regions of a substrate 508 and each has an opposite doping type as an adjoining region of the substrate 508. Further, the drain regions 504 are electrically separated from each other by a trench isolation structure 510 and partially define access transistors 512 (partially shown) used to individually select the RRAM cells 102. The trench isolation structure 510 extends into a top of the substrate 508 and comprises silicon oxide and/or some other suitable dielectric material(s). The trench isolation structure 510 may, for example, be a shallow trench isolation (STI) structure or some other suitable trench isolation structure. The substrate 508 may, for example, be a bulk silicon substrate, a silicon-on-insulator (SOI) substrate, or some other suitable semiconductor substrate.

The drain-side conductive paths 506 electrically couple the drain regions 504 to the RRAM cells 102. Further, the drain-side conductive paths 506 are defined by the interconnect structure 402, which comprises a plurality of wires 404 and a plurality of vias 406. The plurality of wires 404 comprises the top-electrode wires 404t and the bottom-electrode wires 404b. In some embodiments, the top-electrode wires 404t correspond to bit lines BL that are shared by other RRAM cells (not shown). The plurality of vias 406 comprises the top-electrode via 406t. A level of the vias 406 nearest the substrate 508 is in an interlayer dielectric (ILD) layer 514, whereas remaining levels of the vias 406 and the wires 404 are in IMD layers 414. The wires 404 and the vias 406 may be or comprise, for example, copper, aluminum, aluminum copper, some other suitable conductive material(s), or any combination of the foregoing.

A peripheral region 516 to a side of the 1T1R cells 502 accommodates a peripheral device 518 (only partially shown). The peripheral device 518 may, for example, be a metal-oxide-semiconductor field-effect transistor (MOSFET) or some other suitable semiconductor device. The peripheral device 518 comprises a pair of source/drain regions 520 (only one of which is shown) in the substrate 508, and further comprises a gate structure (not shown) between the source/drain regions 520. The source/drain regions 520 are doped regions of the substrate 508 and each has an opposite doping type as an adjoining region of the substrate 508.

Figure 5B:
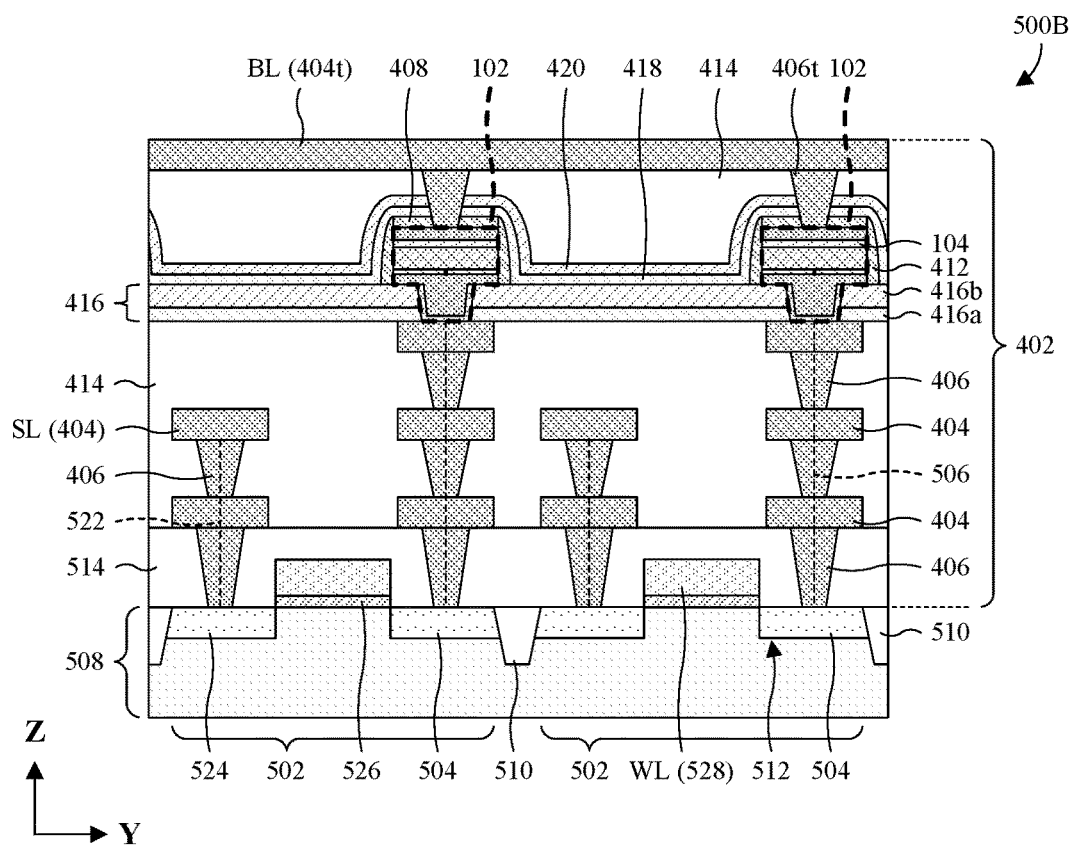

With reference to FIG. 5B, a cross-sectional view 500B of some embodiments of the integrated circuit chip of FIG. 5A is provided along an axis orthogonal to an axis along which the cross-sectional view 500A of FIG. 5A is taken. The 1T1R cells 502 comprise individual RRAM cells 102, individual drain-side conductive paths 506, individual access transistors 512, and individual source-side conductive paths 522. The RRAM cells 102 of FIG. 5B are each as the RRAM cell 102 of FIG. 4A is illustrated and described.

The access transistors 512 are on the substrate 508, between the substrate 508 and the interconnect structure 402. Further, the access transistors 512 are electrically separated from each other by the trench isolation structure 510. The access transistors 512 comprise individual drain regions 504, individual source regions 524, individual gate dielectric layers 526, and individual gate electrodes 528. The gate electrodes 528 respectively overlie the gate dielectric layers 526 and, in some embodiments, define word lines WL. The drain and source regions 504, 524 are doped regions of the substrate 508 and each has an opposite doping type as an adjoining region of the substrate 508. The drain regions 504 respectively border drain sides of the gate electrodes 528, and the source regions 524 respectively border source sides of the gate electrodes 528. The access transistors 512 may, for example, be MOSFETs or some other suitable semiconductor devices.

The drain-side conductive paths 506 electrically couple the drain regions 504 to the RRAM cells 102, and the source-side conductive paths 522 electrically couple the source regions 524 to source lines SL. The drain-side and source-side conductive paths 506, 522 are defined by the plurality of wires 404 and the plurality of vias 406 in the interconnect structure 402.

While FIGS. 5A and 5B are illustrated using RRAM-cell embodiments in FIG. 4A, RRAM-cell embodiments in any one of FIGS. 1, 3, and 4B-4G may alternatively be used. For example, the RRAM cells 102 of FIGS. 5A and 5B may each be as illustrated in FIG. 4F.

Figure 6:
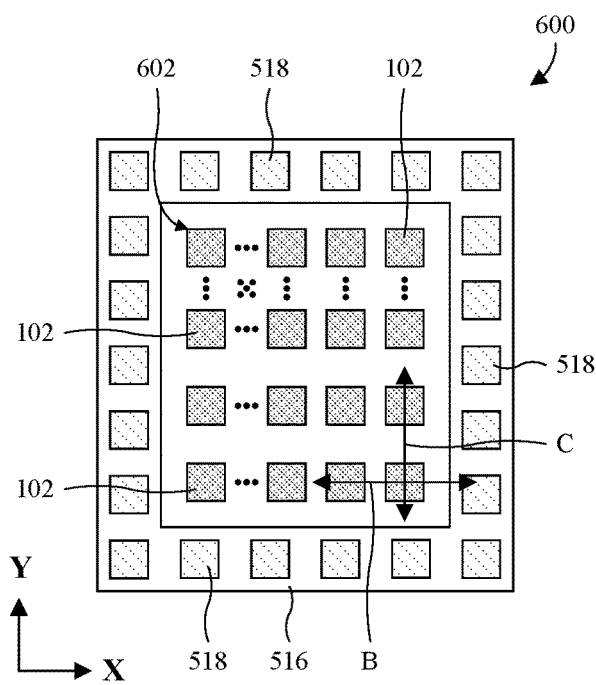
FIG. 6 illustrates a top layout of some embodiments of the integrated circuit chip of FIGS. 5A and 5B.

With reference to FIG. 6, a top layout 600 of some embodiments of the integrated circuit chip of FIGS. 5A and 5B is provided. The cross-sectional views 500A, 500B of FIGS. 5A and 5B may, for example, respectively be taken along lines B and C or other suitable locations. The integrated circuit chip comprises a plurality of RRAM cells 102 in a plurality of rows and a plurality of columns, thereby defining a RRAM array 602. The RRAM cells 102 may, for example, be as illustrated and described in any one of FIGS. 1, 3, 4A-4G, 5A, and 5B. Peripheral devices 518 surround the RRAM array 602 at a peripheral region 516 of the integrated circuit chip. The peripheral devices 518 may, for example, be or comprise transistors and/or other suitable semiconductor device(s). Further, the peripheral devices 518 may, for example, implement read/write circuitry and/or other suitable circuitry for operating the RRAM cells 102.

With reference to FIGS. 7-15, a series of cross-sectional views 700-1500 of some embodiments of a method for forming RRAM cells is provided in which the RRAM cells comprise individual top-electrode barrier layers and are integrated with 1T1R cells in an integrated circuit chip. The cross-sectional views 700-1500 may, for example, be taken along line B or some other suitable location in FIG. 6. Further, the cross-sectional views 700-1500 may, for example, correspond to FIG. 5A and hence may, for example, be as the integrated circuit chip of FIGS. 5A and 5B is illustrated and described.

Figure 7:
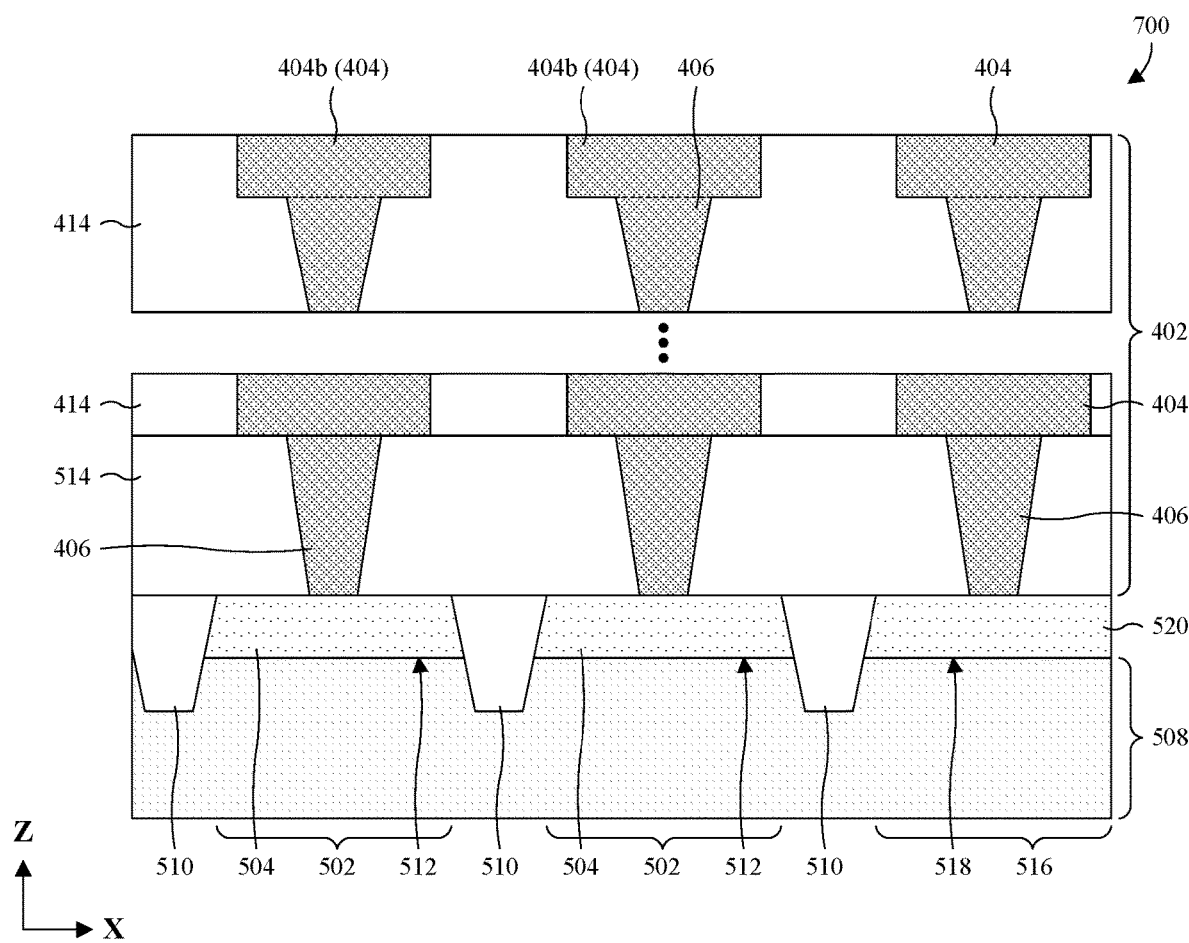
FIGS. 7-15 illustrate a series of cross-sectional views of some embodiments of a method for forming RRAM cells integrated with 1T1R cells and comprising top-electrode barrier layers.

As illustrated by the cross-sectional view 700 of FIG. 7, a trench isolation structure 510 is formed extending into a top of a substrate 508. The trench isolation structure 510 individually surrounds and demarcates regions of the substrate 508 at which 1T1R cells 502 are being formed. Further, the trench isolation structure 510 surrounds and demarcates a peripheral region 516 of the integrated circuit chip.

Also illustrated by the cross-sectional view 700 of FIG. 7, a plurality of semiconductor devices is formed on the substrate 508. The plurality of semiconductor devices comprises access transistors 512 individual to and respectively at the 1T1R cells 502 being formed. Further, the plurality of semiconductor devices comprises a peripheral device 518 at the peripheral region 516 of the integrated circuit chip. The access transistors 512 comprise individual drain regions 504 and individual source regions (not shown) in the substrate 508. Further, the access transistors 512 comprise individual gate structures (not shown). The gate structures have individual drain sides respectively bordering the drain regions 504 and further have individual source sides respectively bordering the source regions. The peripheral device 518 comprises a pair of source/drain regions 520 (only one of which is shown) in the substrate 508 and further comprises a gate structure (not shown) between and bordering the source/drain regions 520.

Also illustrated by the cross-sectional view 700 of FIG. 7, an interconnect structure 402 is partially formed over and electrically coupled to the semiconductor devices (e.g., the access transistor 512 and the peripheral device 518). The interconnect structure 402 comprises a dielectric structure, and further comprises a plurality of wires 404 and a plurality of vias 406 stacked in the dielectric structure. The dielectric structure comprises an ILD layer 514 and a plurality of IMD layers 414 over the ILD layer 514. The plurality of wires 404 comprises a plurality of bottom-electrode wires 404b along a top surface of the interconnect structure 402. The bottom-electrode wires 404b are individual to and respectively at the 1T1R cells 502 being formed. Further, the bottom-electrode wires 404b are respectively electrically coupled to the drain regions 504 of the access transistor 512 by underlying wires and vias.

Figure 8:
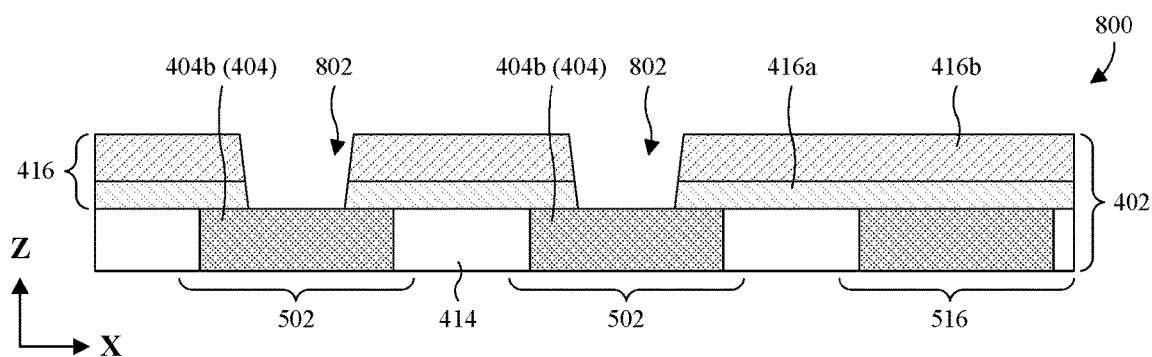

As illustrated by the cross-sectional view 800 of FIG. 8, a via dielectric layer 416 is deposited or otherwise formed on the interconnect structure 402. Note that for drawing compactness, a lower portion of the interconnect structure 402 is omitted herein and in subsequent figures. In some embodiments, the via dielectric layer 416 is a multilayer film comprising a lower via dielectric layer 416a and an upper via dielectric layer 416b overlying the lower via dielectric layer 416a. The lower and upper via dielectric layers 416a, 416b are different materials and may, for example, respectively be or comprise silicon carbide and silicon-rich oxide. Other materials are, however, amenable. In alternative embodiments, the via dielectric layer 416 is a single layer.

Also illustrated by the cross-sectional view 800 of FIG. 8, the via dielectric layer 416 is patterned to form via openings 802 individual to and respectively at the 1T1R cells 502 being formed. The via openings 802 extend through the via dielectric layer 416 and respectively expose the bottom-electrode wires 404b. The patterning may, for example, be performed by a photolithography/etching process or some other suitable patterning process.

Figure 9:
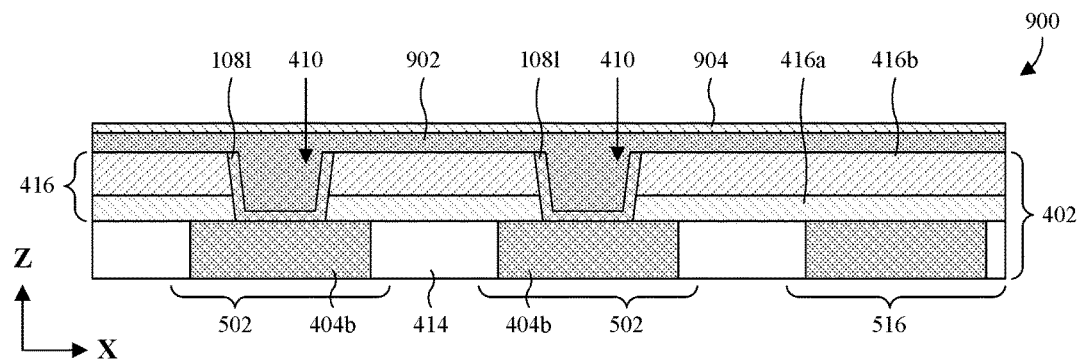

As illustrated by the cross-sectional view 900 of FIG. 9, a bottom electrode layer 902 and bottom-electrode liners 108l are formed. In alternative embodiments, the bottom-electrode liners 108l are omitted. The bottom electrode layer 902 and the bottom-electrode liners 108l fill the via openings 802 (see FIG. 8) and define bottom-electrode vias 410 individual to and respectively in the via openings 802. The bottom electrode layer 902 covers the interconnect structure 402, and the bottom-electrode liners 108l separate the bottom electrode layer 902 from the via dielectric layer 416 and the bottom-electrode wires 404b. The bottom electrode layer 902 has a low reactivity to oxygen and is or comprises titanium nitride and/or some other suitable material(s). Such a low-reactivity material may, for example, be a material depending upon 5 eV or more to react with oxygen. The bottom-electrode liners 108l may, for example, be or comprise tantalum nitride and/or some other suitable material(s).

Also illustrated by the cross-sectional view 900 of FIG. 9, a switching layer 904 is deposited over the bottom electrode layer 902. The switching layer 904 is a solid electrolyte for metal cations that result from oxidation of an active metal layer (not shown; see FIG. 10) hereafter formed. In some embodiments, the switching layer 904 is or comprises silicon nitride and/or some other suitable electrolyte.

Figure 10:
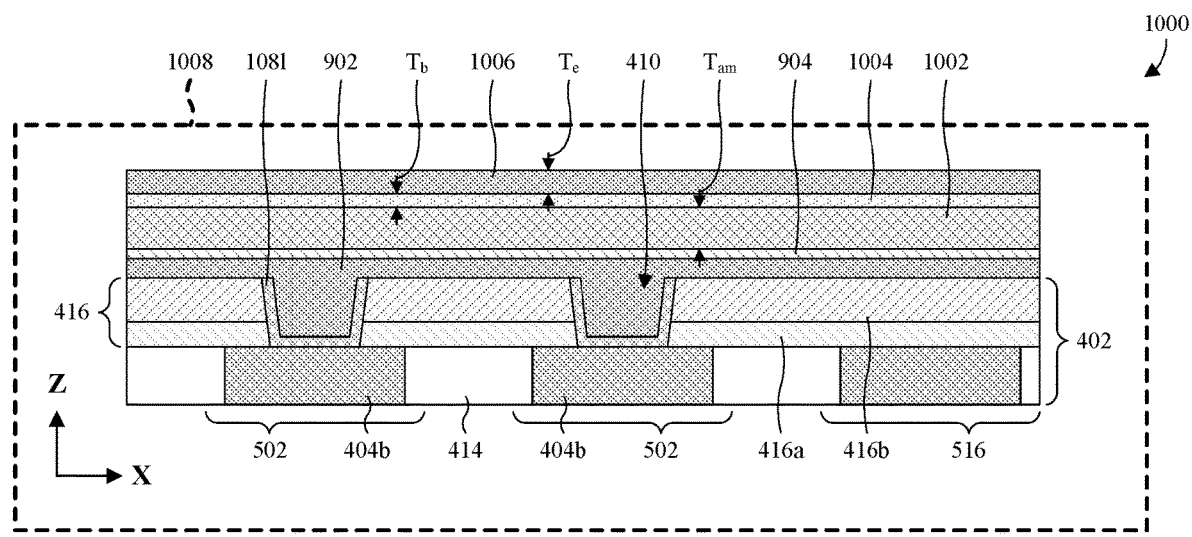

As illustrated by the cross-sectional view 1000 of FIG. 10, an active metal layer 1002, a top-electrode barrier layer 1004, and a top electrode layer 1006 are deposited over the switching layer 904. The top-electrode barrier layer 1004 overlies the active metal layer 1002, and the top electrode layer 1006 overlies the top-electrode barrier layer 1004. The active metal layer 1002, the top-electrode barrier layer 1004, and the top electrode layer 1006 may, for example, be deposited by physical vapor deposition (PVD), chemical vapor deposition (CVD), some other suitable deposition process(es), or any combination of the foregoing.

The active metal layer 1002 is electrochemically active and has a high reactivity to oxygen relative to the top electrode layer 1006. In some embodiments, the active metal layer 1002 also has a high reactivity to oxygen relative to the top-electrode barrier layer 1004. For example, when the active metal layer 1002 is or comprise aluminum and the top-electrode barrier layer 1004 is or comprises tungsten, the active metal layer 1002 may have a high reactivity to oxygen relative to the top-electrode barrier layer 1004. In alternative embodiments, the active metal layer 1002 has a low reactivity to oxygen relative to the top-electrode barrier layer 1004. For example, when the active metal layer 1002 is or comprise aluminum and the top-electrode barrier layer 1004 is or comprises titanium, the active metal layer 1002 may have a lower reactivity to oxygen relative to the top-electrode barrier layer 1004. Further, the active metal layer 1002 is such that the active metal layer 1002 may be electrochemically dissolved into and conducted through the switching layer 904. In some embodiments, the active metal layer 1002 is or comprises aluminum and/or some other suitable material(s).

The top electrode layer 1006 has a low reactivity to oxygen compared to the active metal layer 1002 and the top-electrode barrier layer 1004. Further, the top electrode layer 1006 blocks oxygen from reaching the active metal layer 1002 and the top-electrode barrier layer 1004 during subsequent processing. If oxygen were to reach such layers, oxide may form on the active metal layer 1002 and/or the top-electrode barrier layer 1004, thereby increasing a resistance of an RRAM cell being formed. Such an increase, in turn, may shift operating parameters of the RRAM cell out of specification and/or may reduce manufacturing yields. In some embodiments, the top electrode layer 1006 is or comprise titanium nitride, tantalum nitride, tungsten nitride, some other suitable material(s), or any combination of the foregoing.

The top electrode layer 1006 comprises a metal element and a non-metal element. In some but not all embodiments, the top electrode layer 1006 consists of or consist essentially of the metal element and the non-metal element. The non-metal element reduces locations at which oxygen may bond to the metal element and hence reduces oxygen reactivity. As a result, the top electrode layer 1006 may be formed without using platinum, ruthenium, and other expensive noble metals. In some embodiments, a ratio of atoms of the metal element to atoms of the non-metal element is between about 1:1 and 1:1.1 to substantially saturate locations at which oxygen may bond to the metal element. In some embodiments, an atomic percentage of the metal element is about 50% and/or an atomic percentage of the non-metal element is about 50%. The metal element may, for example, be titanium, tungsten, tantalum, or some other suitable element, and/or the non-metal element may, for example, be nitrogen or some other suitable element.

While the non-metal element lowers oxygen reactivity and allows the top electrode layer 1006 to be formed at less expense, the non-metal element may result in parasitic resistance if not for the top-electrode barrier layer 1004. For example, in at least embodiments in which the non-metal element is nitrogen and the active metal layer 1002 is aluminum, nitrogen would diffuse into the active metal layer 1002 if not for the top-electrode barrier layer 1004. The nitrogen may, for example, originate from nitrogen gas used to form the top electrode layer 1006 and/or from the top electrode layer 1006 itself. The nitrogen that diffused into the active metal layer 1002 would, in turn, create an undesired switching layer between the active metal layer 1002 and the top electrode layer 1006 and would hence increase parasitic resistance. The top-electrode barrier layer 1004 blocks or otherwise slows diffusion of the non-metal element into the active metal layer 1002 to prevent the undesired switching layer from forming and hence to reduce the parasitic resistance. By reducing parasitic resistance, a switching window of the RRAM cell being formed may be enlarged, reliability may be improved, and manufacturing yields may be higher.

In some embodiments, the top electrode layer 1006 has an electrode thicknesses $T_e$ that is about 150-250 angstroms, about 150-200 angstroms, about 200-250 angstroms, or about 200 angstroms. In some embodiments, the active metal layer 1002 has an active-metal thickness $T_{am}$ that is about 10-500 angstroms, about 10-255 angstroms, about 255-500 angstroms, or about 400 angstroms. Other thicknesses are, however, amenable.

The top-electrode barrier layer 1004 is conductive and, as described above, is configured to block or otherwise slow the non-metal element of the top electrode layer 1006 from diffusing to the active metal layer 1002. In some embodiments, the top-electrode barrier layer 1004 is or comprises the metal element of the top electrode layer 1006. In some but not all embodiments, the top-electrode barrier layer 1004 consists of or consists essentially of a single metal element. In some embodiments, the top-electrode barrier layer 1004 has an amorphous structure so as to eliminate grain boundaries and to increase diffusion-path complexity for the non-metal element of the top electrode layer 1006. Alternatively, in some embodiments, the top-electrode barrier layer 1004 has a nanocrystalline structure and metal grains of the top-electrode barrier layer 1004 are equiaxed grains, instead of columnar grains, so as to increase diffusion-path complexity for the non-metal element of the top electrode layer 1006. By increasing diffusion-path complexity, diffusion of the non-metal element through the top-electrode barrier layer 1004 is slowed or otherwise stopped. In some embodiments, the top-electrode barrier layer 1004 is or comprises titanium, tantalum, tungsten, some other suitable material(s), or any combination of the foregoing. In some embodiments, a resistance from a top surface of the top electrode layer 1006 to a bottom surface of the top-electrode barrier layer 1004 is about 30 ohms, less than about 1000 ohms, about 10-100 ohms, or some other suitable value.

In some embodiments, the top-electrode barrier layer 1004 has a barrier thickness $T_b$ of about 50-100 angstroms, about 50-75 angstroms, about 75-100 angstroms, or about 50 angstroms. Other thicknesses are, however, amenable. If the top-electrode barrier layer 1004 is too thin (e.g., less than about 50 angstroms or some other suitable value), the top-electrode barrier layer 1004 may be unable to block or otherwise slow migration of the non-metal element of the top electrode layer 1006 through the top-electrode barrier layer 1004. On the other hand, if the top-electrode barrier layer 1004 is too thick (e.g., more than about 100 angstroms or some other suitable value), the top-electrode barrier layer 1004 may introduce too much resistance into the RRAM cell being formed and may hence shift operating parameters of the RRAM cell out of specification. Additionally, or alternatively, if the top-electrode barrier layer 1004 is too thick (e.g., more than about 100 angstrom or some other suitable value), the top-electrode barrier layer 1004 may make integration with existing manufacturing processes more difficult. In some embodiments, a ratio of the barrier thickness $T_b$ to the electrode thicknesses $T_e$ of the top electrode layer 1006 is about 1:2-4 or some other suitable ratio. In some embodiments, a sum of the barrier thickness $T_b$ and the electrode thicknesses $T_e$ of the top electrode layer 1006 is less than about 250 angstroms, about 200-300 angstroms, or some other suitable value.

As noted above, the active metal layer 1002, the top-electrode barrier layer 1004, and the top electrode layer 1006 may, for example, be deposited by PVD, CVD, some other suitable deposition process(es), or any combination of the foregoing. In embodiments in which the top electrode layer 1006 is or comprises a metal nitride, nitrogen gas may be employed to form the top electrode layer 1006. Without the top-electrode barrier layer 1004 covering the active metal layer 1002, the nitrogen gas could directly impinge on the active metal layer 1002 and diffuse into the active metal layer 1002. As noted above, this would create an undesired switching layer that introduces parasitic resistance to the RRAM cell being formed. Hence, the top-electrode barrier layer 1004 protects the active metal layer 112 from ambient gases (e.g., nitrogen gas) that could diffuse into the active metal layer 112 and create the undesired switching layer.

In some embodiments, the top-electrode barrier layer 1004 and the top electrode layer 1006 are formed together by a PVD process within the same PVD process chamber 1008. As such, the semiconductor structure upon which the top-electrode barrier layer 1004 and the top electrode layer 1006 are formed remains within the PVD process chamber 1008 and, in some embodiments, remains stationary from a beginning of the PVD process to and end of the PVD process. This prevents oxide from forming on the top-electrode barrier layer 1004 between the forming of the top-electrode barrier layer 1004 and the top electrode layer 1006. The PVD process comprises a first PVD step to form the top-electrode barrier layer 1004 and further comprises a second PVD step to form the top electrode layer 1006 overlying the top-electrode barrier layer 1004.

The first PVD step may, for example, comprise PVD deposition using a PVD target for about 1-10 seconds (e.g., about 3 seconds or some other suitable value) while argon gas, but not nitrogen gas, is flowed into the PVD process chamber 1008. The second PVD step may, for example, comprise PVD deposition using the PVD target for about 5-15 seconds (e.g., about 10 seconds or some other suitable value) while both argon gas and nitrogen gas are flowed into the PVD process chamber 1008. Hence, nitrogen gas is not flowed into the PVD process chamber 1008 while forming the top-electrode barrier layer 1004 and is then added to the PVD process chamber 1008 while forming the top electrode layer 1006. A flow rate for the argon gas during the first PVD step may, for example, be about 300 standard cubic centimeters per minute (SCCM), about 250-350 SCCM, or some other suitable flow rate. A flow rate for the argon gas during the second PVD step is less than during the first PVD step and may, for example, be about 200 SCCM, about 150-250 SCCM, or some other suitable flow rate. A flow rate for the nitrogen gas during the second PVD step may, for example, be about 80 standard SCCM, about 50-150 SCCM, or some other suitable flow rate. A temperature within the PVD process chamber 1008 during the first and/or second PVD steps may, for example, be about 25 degrees Celsius, about 20-30 degrees Celsius, or some other suitable temperature. The PVD target may, for example, be or comprise titanium, tungsten, a tantalum, or some other suitable material.

In some embodiments, the active metal layer 1002 is formed in situ with the top-electrode barrier layer 1004 and the top electrode layer 1006. This prevents oxide from forming on the active metal layer 1002 and the top-electrode barrier layer 1004 between the forming of the active metal layer 1002 and the top electrode layer 1006. The in-situ formation may, for example, be localized to the PVD process chamber 1008 and/or a multi-chamber process tool.

In some embodiments in which the in-situ formation is localized to the multi-chamber process tool, the structure of FIG. 9 is loaded into the multi-chamber process tool and the active metal layer 1002, the top-electrode barrier layer 1004, and the top electrode layer 1006 are then deposited within the multi-chamber process tool. In these embodiments, the structure is not removed from the multi-chamber process until after the deposition of the top electrode layer 1006 is completed. The multi-chamber process tool may, for example, have the PVD process chamber 1008 for deposition of the top-electrode barrier layer 1004 and the top electrode layer 1006 and may further have another PVD process chamber for deposition of the active metal layer 1002. In some embodiments in which the in-situ formation is localized to the PVD process chamber 1008, the structure of FIG. 9 is loaded into the PVD process chamber 1008 and the active metal layer 1002, the top-electrode barrier layer 1004, and the top electrode layer 1006 are then deposited within the PVD process chamber 1008. In these embodiments, the structure is not removed from the PVD process chamber 1008 until after the deposition of the top electrode layer 1006 is completed. In at least some of these embodiments, the PVD process chamber 1008 may accommodate multiple PVD targets and/or allow the PVD target to be changed without disrupting an atmosphere within the PVD process chamber 1008.

Figure 11:
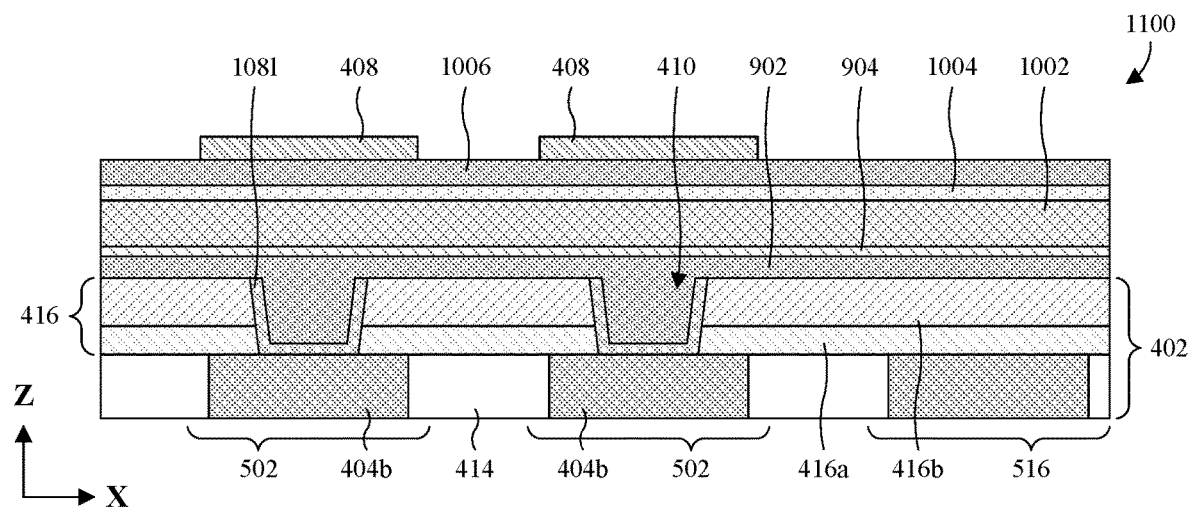

As illustrated by the cross-sectional view 1100 of FIG. 11, hard masks 408 are formed individual to and respectively at the 1T1R cells 502 being formed. As seen hereafter, the hard masks 408 have patterns for RRAM cells of the 1T1R cells 502. The hard masks 408 may, for example, be formed by depositing a hard mask layer over the top electrode layer 1006 and subsequently patterning the hard mask layer into the hard masks 408. The patterning may, for example, be performed by a photolithography/etching process or some other suitable patterning process.

Figure 12:
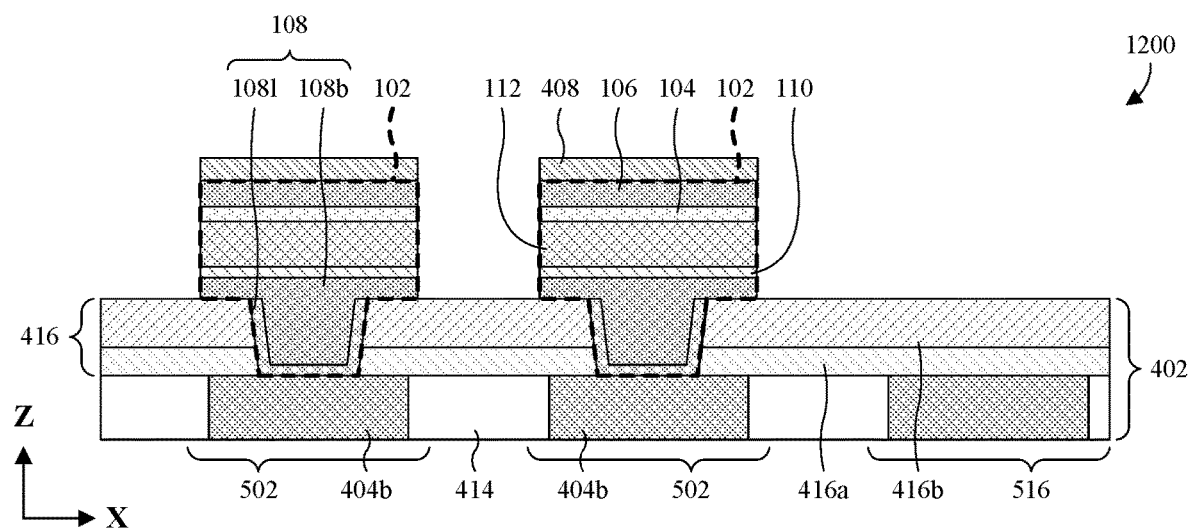

As illustrated by the cross-sectional view 1200 of FIG. 12, an etch is performed into the top electrode layer 1006 (see FIG. 11), the top-electrode barrier layer 1004 (see FIG. 11), the active metal layer 1002 (see FIG. 11), the switching layer 904 (see FIG. 11), and the bottom electrode layer 902 (see FIG. 11) with the hard masks 408 in place. The etch transfers patterns of the hard masks 408 to the underlying layers to form RRAM cells 102 individual to and respectively at the 1T1R cells 502. The RRAM cells 102 comprise individual top electrodes 106, individual top-electrode barrier layers 104, individual active metal layers 112, individual switching layers 110, and individual bottom electrodes 108. The individual bottom electrodes 108 comprise the bottom-electrode liners 108*l* and bottom-electrode bodies 108*b*.

By arranging the individual top-electrode barrier layers 104 between the individual top electrodes 106 and the individual active metal layers 112, parasitic resistance may be reduced. For example, suppose an active metal layer 112 of an RRAM cell 102 is or comprises aluminum and a top electrode 106 of the RRAM cell 102 is or comprise a metal nitride. In this example, the top-electrode barrier layer 104 of the RRAM cell 102 blocks nitrogen of the top electrode 106 and/or nitrogen gas used during formation of the top electrode 106 from diffusing to the active metal layer 112 and forming an undesired switching layer between the active metal layer 112 and the top electrode 106. Such an undesired switching layer would introduce a parasitic resistance that increases an overall resistance of the RRAM cell 102. This, in turn, may shift operating parameters of the RRAM cell 102 out of specification and may decrease manufacturing yields. Accordingly, because the top-electrode barrier layers 104 stops formation of the undesired switching layer, parasitic resistance is reduced and manufacturing yields may be high.

Figure 13:
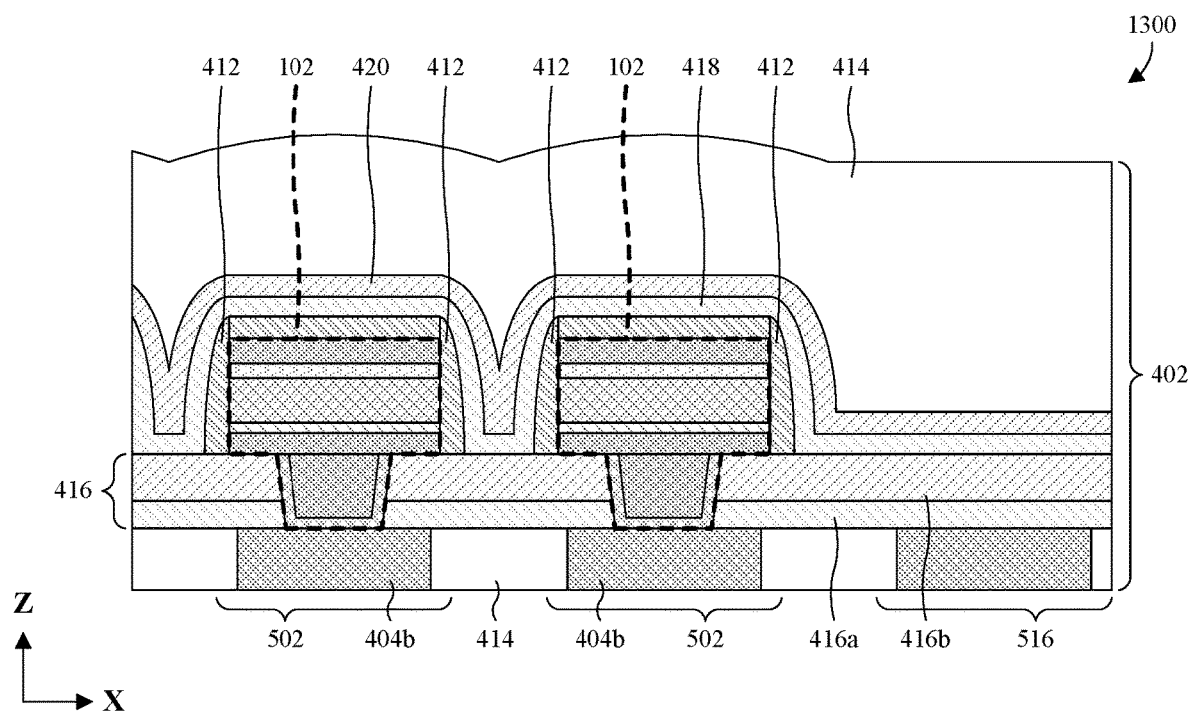

As illustrated by the cross-sectional view 1300 of FIG. 13, sidewall spacer structures 412 are formed on sidewalls of the RRAM cells 102. Further, an etch stop layer 418, an IMD liner 420, and an additional IMD layer 414 are deposited over the RRAM cells 102 and the sidewall spacer structures 412. The IMD liner 420 overlies the etch stop layer 418, and the additional IMD layer 414 overlies the IMD liner 420.

Figure 14:
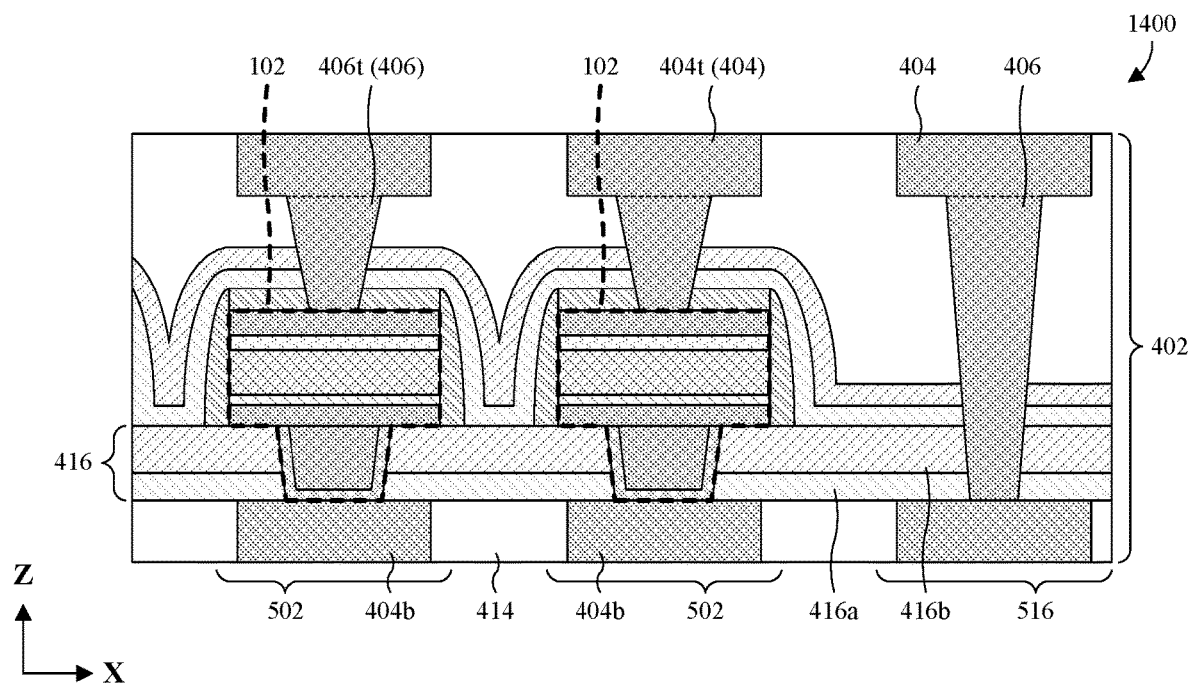

As illustrated by the cross-sectional view 1400 of FIG. 14, a plurality of additional wires 404 and a plurality of additional vias 406 are formed over the RRAM cells 102, recessed into the additional IMD layer 414 above the RRAM cells 102. The plurality of additional wires 404 comprises top-electrode wires 404*t* respectively overlying the RRAM cells 102, and the plurality of additional vias 406 comprises top-electrode vias 406*t* extending from the top-electrode wires 404*t* to the RRAM cells 102.

Figure 15:
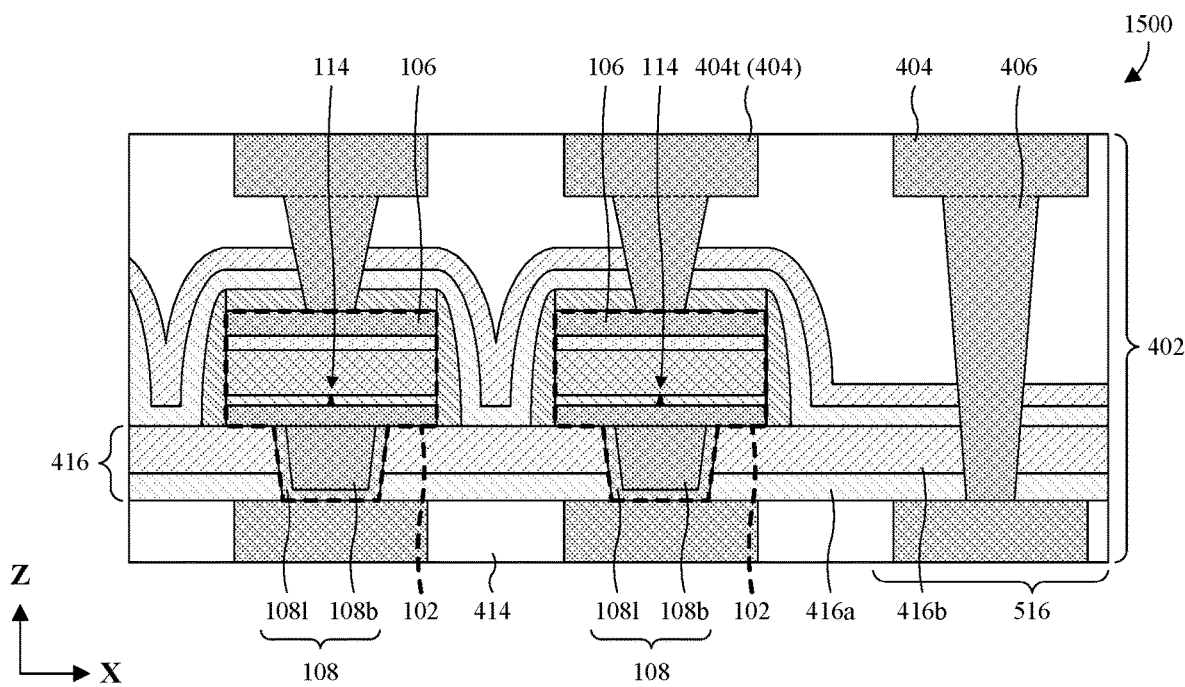

As illustrated by the cross-sectional view 1500 of FIG. 15, metal filaments 114 individual to and respectively in the switching layers 110 are formed. The forming may, for example, comprise applying a forming voltage across each of the RRAM cells 102. For example, the bottom electrodes 108 of the RRAM cells 102 may be grounded while the top electrodes 106 are biased. Other processes for forming the metal filaments 114 are, however, amenable.

While FIGS. 7-15 are described with reference to a method, it will be appreciated that the structures shown in FIGS. 7-15 are not limited to the method but rather may stand alone separate of the method. While FIGS. 7-15 are described as a series of acts, it will be appreciated that the order of the acts may be altered in other embodiments. While FIGS. 7-15 illustrate and describe as a specific set of acts, some acts that are illustrated and/or described may be omitted in other embodiments. Further, acts that are not illustrated and/or described may be included in other embodiments. While FIGS. 7-15 illustrate the method with embodiments of the RRAM cells 102 in FIG. 5A, alternative embodiments of the method may be performed with embodiments of the RRAM cells 102 in any one or combination of FIGS. 1, 3, and 4A-4E.

In some embodiments, to perform the method with embodiments of the RRAM cells 102 in FIG. 4C, the etch at FIG. 12 stops at the switching layer 904. This forms the individual top electrodes 106, the individual top-electrode barrier layers 104, and the individual active metal layers 112, examples of each are shown in FIG. 4C. The sidewall spacer structures 412 are then formed as described at FIG. 13. Further, an additional etch is selectively performed into the switching layer 904 and the bottom electrode layer 902 using the hard masks 408 and the sidewall spacer structures 412 as a mask. The additional etch is performed between the forming of the sidewall spacer structures 412 at FIG. 13 and the depositing of the etch stop layer 418 at FIG. 13. The additional etch forms the individual switching layers 110 and the individual bottom electrodes 108, examples of each are shown in FIG. 4C. After the additional etch, the method proceeds as described above from the depositing of the etch stop layer 418 at FIG. 13.

In some embodiments, to perform the method with embodiments of the RRAM cells 102 in FIG. 4D, the etch at FIG. 12 stops at the top-electrode barrier layer 1004. This forms the individual top electrodes 106, examples of each are shown in FIG. 4D. A first sidewall spacer structure 412*a* is then formed on sidewalls of the hard masks 408 and the top electrodes 106, an example of which is shown at FIG. 4D. Further, an additional etch is selectively performed into the top-electrode barrier layer 1004, the active metal layer 1002, the switching layer 904, and the bottom electrode layer 902 using the hard masks 408 and the first sidewall spacer structures 412*a* as a mask. The additional etch is performed between the forming of the first sidewall spacer structures 412*a* and the forming of the sidewall spacer structure 412 at FIG. 13. The additional etch forms the individual top-electrode barrier layers 104, the individual active metal layers 112, the individual switching layers 110, and the individual bottom electrodes 108, examples of each are shown in FIG. 4D. After the additional etch, the method proceeds as described above from the forming of the sidewall spacer structure 412 at FIG. 13. In these embodiments, the sidewall spacer structure 412 formed at FIG. 13 may be more aptly referred to as a second sidewall spacer structure 412*b*, an example of which is shown at FIG. 4D.

Figure 16:
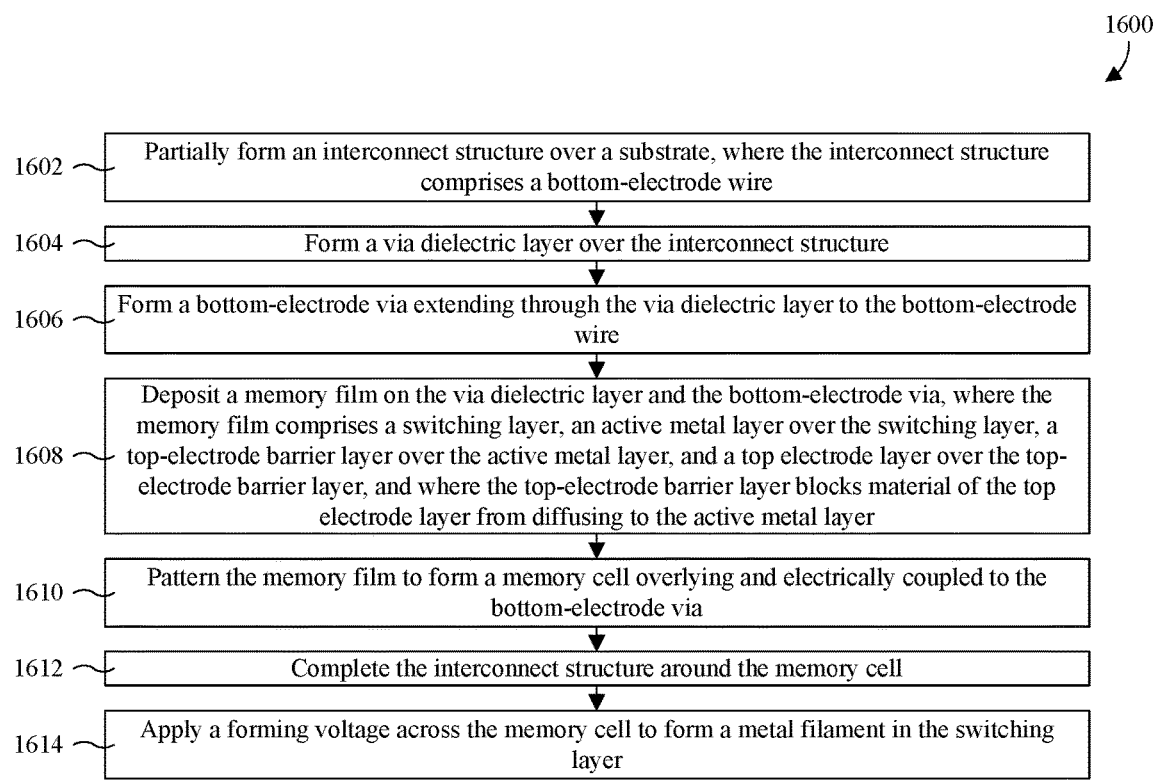
FIG. 16 illustrates a block diagram of some embodiments of the method of FIGS. 7-15.

With reference to FIG. 16, a block diagram 1600 of some embodiments of the method of FIGS. 7-15 is provided.

At 1602, an interconnect structure is partially formed over a substrate, where the interconnect structure comprises a bottom-electrode wire. See, for example, FIG. 7.

At 1604, a via dielectric layer is formed over the interconnect structure. See, for example, FIG. 8.

At 1606, a bottom-electrode via is formed extending through the via dielectric layer to the bottom-electrode wire. See, for example, FIGS. 8 and 9.

At 1608, a memory film is formed on the via dielectric layer and the bottom-electrode via, where the memory film comprises a switching layer, an active metal layer over the switching layer, a top-electrode barrier layer over the active metal layer, and a top electrode layer over the top-electrode barrier layer, and where the top-electrode barrier layer blocks material of the top electrode layer from diffusing to the active metal layer. See, for example, FIGS. 9 and 10.

At 1610, the memory film is patterned to form a memory cell overlying and electrically coupled to the bottom-electrode via. See, for example, FIGS. 11 and 12.

At 1612, the interconnect structure is completed around the memory cell. See, for example, FIGS. 13 and 14.

At 1614, a forming voltage is applied across the memory cell to form a metal filament in the switching layer. See, for example, FIG. 15.

While the block diagram 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 17-21, a series of cross-sectional views 1700-2100 of some alternative embodiments of the method of FIGS. 7-15 is provided in which the method is performed with embodiments of the RRAM cells 102 in FIG. 4F. As with the cross-sectional views 700-1500 of FIGS. 7-15, the cross-sectional views 1700-2100 may, for example, be taken along line B or some other suitable location in FIG. 6

Figure 17:
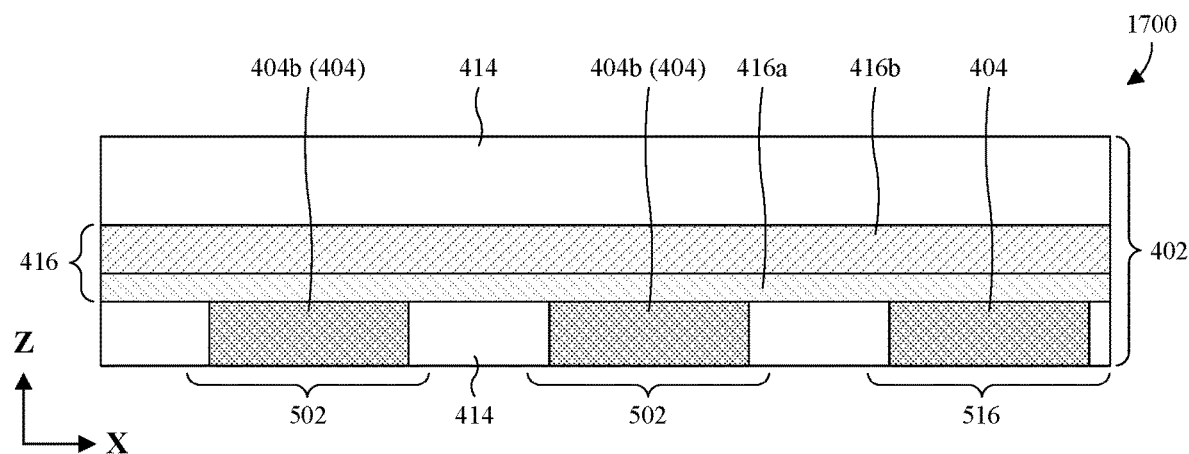
FIGS. 17-21 illustrate a series of cross-sectional views of some alternative embodiments of the method of FIGS. 7-15 in which the top-electrode barrier layers have U-shaped profiles.

As illustrated by the cross-sectional view 1700 of FIG. 17, an interconnect structure 402 is partially formed. The interconnect structure 402 comprises a dielectric structure, a plurality of wires 404, and a plurality of vias (not shown). The dielectric structure comprises a plurality of IMD layers 414 and further comprises a via dielectric layer 416 between the IMD layers 414. In some embodiments, the via dielectric layer 416 is a multilayer film comprising a lower via dielectric layer 416*a* and an upper via dielectric layer 416*b* overlying the lower via dielectric layer 416*a*. In alternative embodiments, the via dielectric layer 416 is a single layer. Further, the wires 404 and the vias are alternatingly stacked in the dielectric structure to define conductive paths. The interconnect structure 402 may, for example, be partially formed as illustrated and described with regard to FIG. 7. Note that only an upper portion of the interconnect structure 402 is illustrated for drawing compactness. A remainder of the interconnect structure 402 may, for example, be as illustrated in FIG. 7. Further note that even though not shown, the interconnect structure 402 overlies and is electrically coupled to a substrate and semiconductor devices. The substrate and/or the semiconductor devices may, for example, be as illustrated at FIG. 7 and/or may, for example, be formed as described with regard to FIG. 7.

Figure 18:
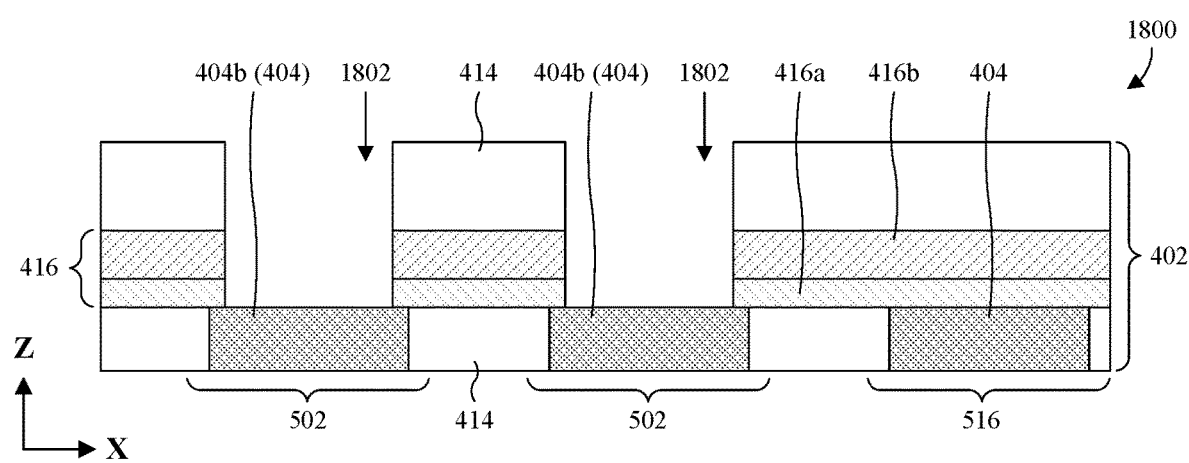

As illustrated by the cross-sectional view 1800 of FIG. 18, the via dielectric layer 416 and the IMD layer 414 atop the via dielectric layer 416 are patterned to form memory-cell openings 1802 individual to and respectively at the 1T1R cells 502 being formed. The patterning may, for example, be performed by a photolithography/etching process or some other suitable patterning process.

Figure 19:
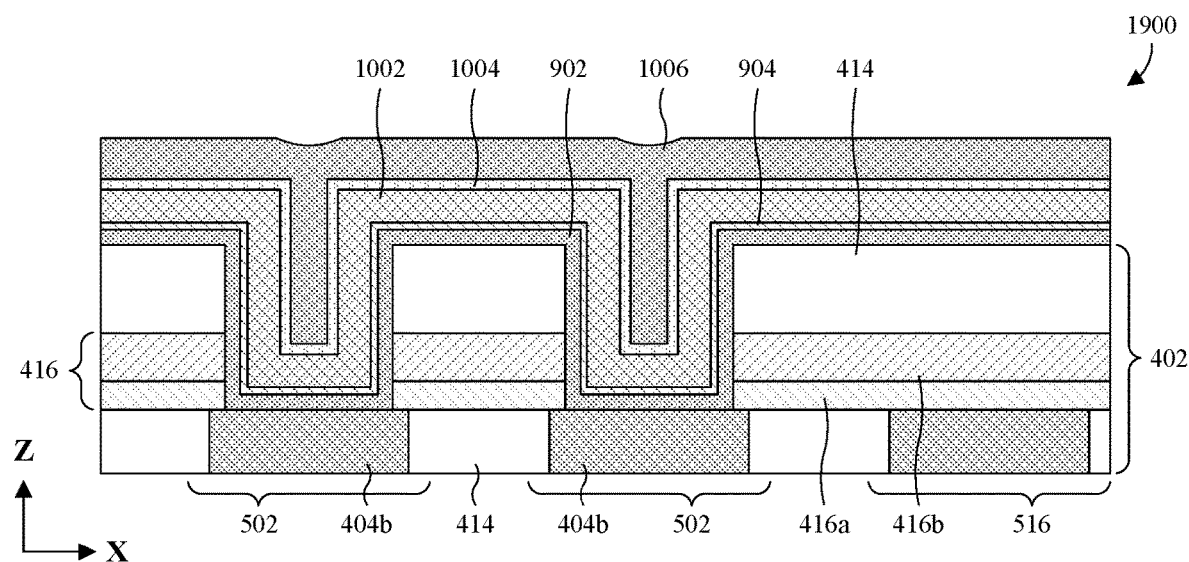

As illustrated by the cross-sectional view 1900 of FIG. 19, a bottom electrode layer 902, a switching layer 904, an active metal layer 1002, a top-electrode barrier layer 1004, and a top electrode layer 1006 are deposited lining the memory-cell openings 1802 (see FIG. 18). The bottom electrode layer 902, the switching layer 904, the active metal layer 1002, the top-electrode barrier layer 1004, and the top electrode layer 1006 may, for example, be as described with regard to FIGS. 9 and 10 and may, for example, be formed as described with regard to FIGS. 9 and 10. For example, the top-electrode barrier layer 1004 and the top electrode layer 1006 may be deposited together by a PVD process, an example of which is described with regard to FIG. 10. As another example, the active metal layer 1002, the top-electrode barrier layer 1004, and the top electrode layer 1006 may be deposited in situ within a common process chamber (e.g., the PVD process chamber 1008 of FIG. 10) and/or within a common multi-chamber process tool.

Figure 20:
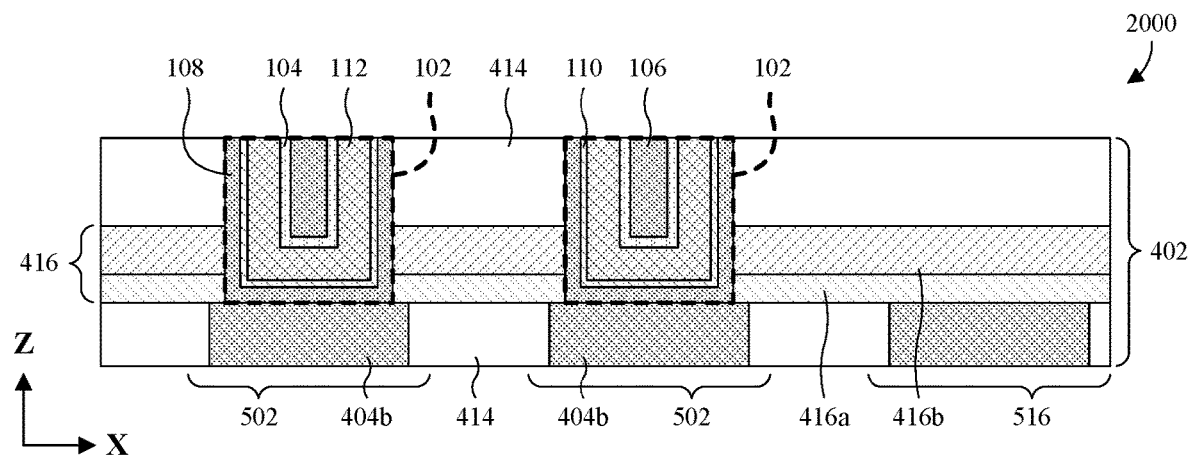

As illustrated by the cross-sectional view 2000 of FIG. 20, a planarization is performed into the bottom electrode layer 902 (see FIG. 19), the switching layer 904 (see FIG. 19), the active metal layer 1002 (see FIG. 19), the top-electrode barrier layer 1004 (see FIG. 19), and the top electrode layer 1006 (see FIG. 19) to form RRAM cells 102 individual to and respectively at the 1T1R cells 502. The RRAM cells 102 comprise individual top electrodes 106, individual top-electrode barrier layers 104, individual active metal layers 112, individual switching layers 110, and individual bottom electrodes 108. The planarization may, for example, be or comprise a CMP or some other suitable planarization.

Because the planarization transfers a pattern from the patterning at FIG. 18 to the various layers of the RRAM cells 102, the RRAM cells 102 may be formed by a single photolithography/etching process. This is in contrast to the multiple photolithography/etching processes (e.g., respectively at FIGS. 8 and 11) that may be used to form the RRAM cells 102 at FIGS. 7-15. By reducing the number of photolithography/etching processes, costs are reduced.

Figure 21:
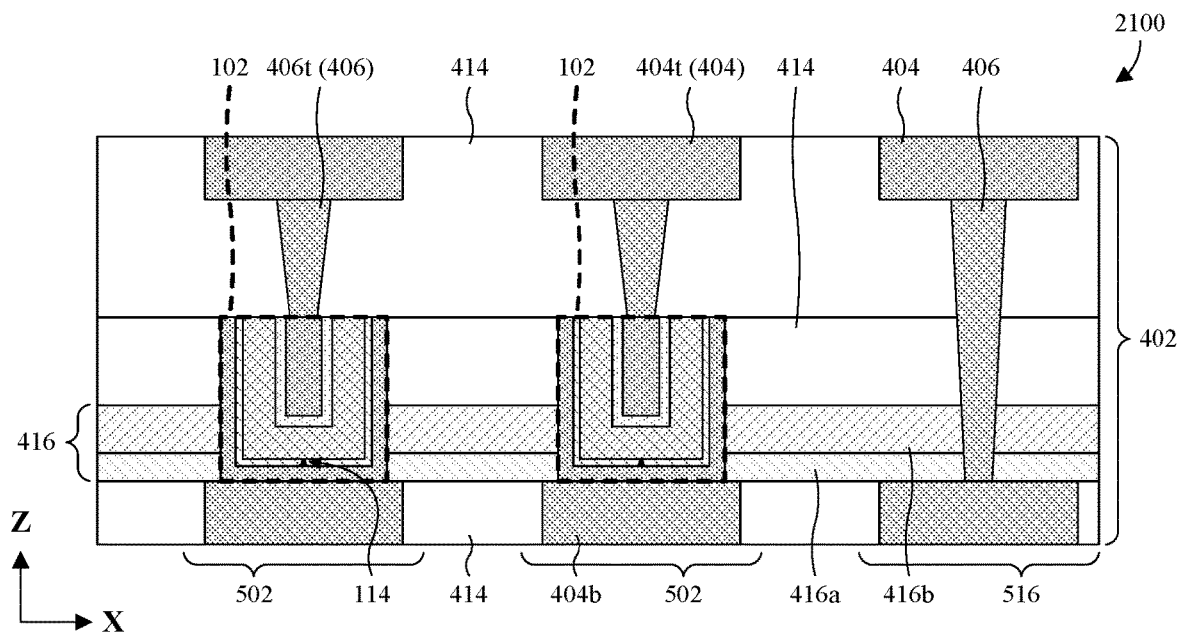

As illustrated by the cross-sectional view 2100 of FIG. 21, an additional IMD layer 414 is deposited over the RRAM cells 102. Further, a plurality of additional wires 404 and a plurality of additional vias 406 are formed over the RRAM cells 102, recessed into the additional IMD layer 414 above the RRAM cells 102. The plurality of additional wires 404 and the plurality of additional vias 406 may, for example, be formed as described with regard to FIGS. 13 and 14.

Also illustrated by the cross-sectional view 2100 of FIG. 21, metal filaments 114 individual to and respectively in the switching layers 110 are formed. The forming may, for example, be performed as described with regard to FIG. 15.

While FIGS. 17-21 are described with reference to a method, it will be appreciated that the structures shown in FIGS. 17-21 are not limited to the method but rather may stand alone separate of the method. While FIGS. 17-21 are described as a series of acts, it will be appreciated that the order of the acts may be altered in other embodiments. While FIGS. 17-21 illustrate and describe as a specific set of acts, some acts that are illustrated and/or described may be omitted in other embodiments. Further, acts that are not illustrated and/or described may be included in other embodiments. While FIGS. 17-21 illustrate the method with embodiments of the RRAM cells 102 in FIG. 4F, alternative embodiments of the method may be performed with embodiments of the RRAM cells 102 in FIGS. 1, 3, and 4G.

In some embodiments, to perform the method with embodiments of the RRAM cells 102 in FIG. 4G, the acts at FIGS. 8 and 9 are performed between the depositing of the via dielectric layer 416 and the depositing of the IMD layer 414 atop the via dielectric layer 416 at FIG. 17. Further, the resulting bottom electrode layer 902 and the resulting switching layer 904 are patterned between the depositing of the via dielectric layer 416 and the depositing of the IMD layer 414 atop the via dielectric layer 416 at FIG. 17. The patterning forms individual bottom electrodes 108 and individual switching layers 110, examples of which are seen at FIG. 12, and may, for example, be performed by a photolithography/etching process or some other suitable patterning process. After depositing the IMD layer 414 atop the via dielectric layer 416 at FIG. 17, a planarization is performed into a top of the IMD layer 414. Further, the method proceeds as described above from the patterning of the IMD layer 414 at FIG. 18. However, instead of the patterning at FIG. 18 exposing bottom-electrode wire 404b, the patterning exposes the individual switching layers 110.

Figure 22:
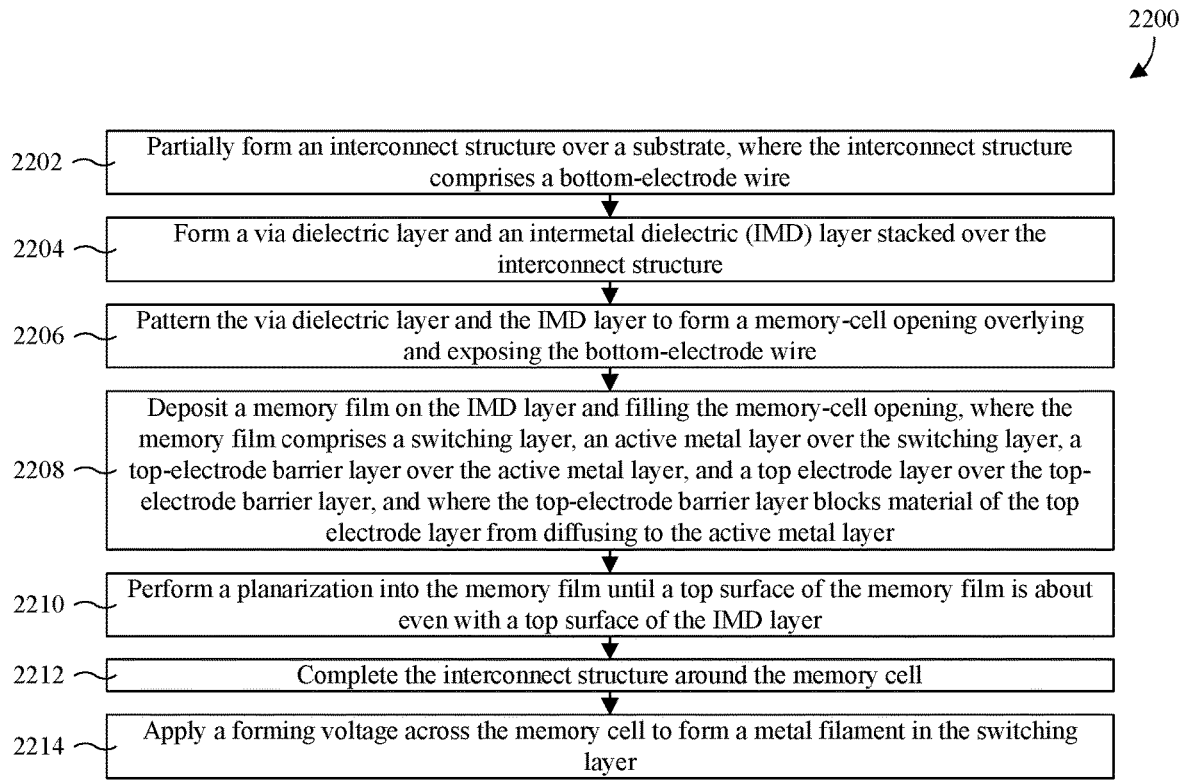
FIG. 22 illustrates a block diagram of some embodiments of the method of FIGS. 17-21.

With reference to FIG. 22, a block diagram 2200 of some embodiments of the method of FIGS. 17-21 is provided.

At 2202, an interconnect structure is partially formed over a substrate, where the interconnect structure comprises a bottom-electrode wire. See, for example, FIG. 17.

At 2204, a via dielectric layer and an IMD layer are formed stacked over the interconnect structure. See, for example, FIG. 17.

At 2206, the via dielectric layer and the IMD layer are patterned to form a memory-cell opening overlying and exposing the bottom-electrode wire. See, for example, FIG. 18.

At 2208, a memory film is deposited on the IMD layer and filling the memory-cell opening, where the memory film comprises a switching layer, an active metal layer over the switching layer, a top-electrode barrier layer over the active metal layer, and a top electrode layer over the top-electrode barrier layer, and where the top-electrode barrier layer blocks material of the top electrode layer from diffusing to the active metal layer. See, for example, FIG. 19.

At 2210, a planarization is performed into the memory film until a top surface of the memory film is about even with a top surface of the IMD layer. See, for example, FIG. 20.

At 2212, the interconnect structure is completed around the memory cell. See, for example, FIG. 21.

At 2214, a forming voltage is applied across the memory cell to form a metal filament in the switching layer. See, for example, FIG. 21.

While the block diagram 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a RRAM cell including: a bottom electrode; a switching layer over the bottom electrode; an active metal layer over the switching layer; a top electrode over the active metal layer, wherein the top electrode includes a metal element and a non-metal element, and wherein the top electrode has a lower reactivity to oxygen than the active metal layer; and a barrier layer between the top electrode and the active metal layer, wherein the barrier layer is conductive and is configured to block diffusion of the non-metal element from the top electrode to the active metal layer. In some embodiments, the barrier layer consists essentially of the metal element. In some embodiments, the non-metal element is nitrogen. In some embodiments, the top electrode includes titanium nitride, tantalum nitride, or tungsten nitride, the active metal layer includes aluminum, and the barrier layer consists essentially of titanium, tantalum, or tungsten. In some embodiments, a thickness of the barrier layer is between about 50-100 angstroms. In some embodiments, a ratio of atoms of the metal element in the top electrode and atoms of the non-metal element in the top electrode is about 1:1 to about 1:1.1. In some embodiments, the barrier layer has a higher reactivity with oxygen than the active metal layer. In some embodiments, the barrier layer has a lower reactivity with oxygen than the active metal layer. In some embodiments, the active metal layer includes a majority element, wherein the RRAM cell further includes a conductive filament in the switching layer, and wherein the conductive filament consists essentially of the majority element.

In some embodiments, the present disclosure provides an integrated chip including: a substrate; and a memory cell over the substrate and including: a bottom electrode; a solid electrolyte layer over the bottom electrode; a metal layer over the solid electrolyte layer and configured to electrochemically dissolve in the solid electrolyte layer; a top electrode over the metal layer and including a metal nitride; and a barrier layer between and directly contacting the top electrode and the metal layer, wherein the barrier layer includes titanium, tantalum, or tungsten, and wherein the barrier layer is substantially devoid of nitrogen along a bottom of the barrier layer. In some embodiments, the barrier layer has a U-shaped profile. In some embodiments, a width of the barrier layer is less than a width of the metal layer. In some embodiments, the integrated chip further includes: a wire underlying the bottom electrode; and a via dielectric layer between the wire and the memory cell, wherein the bottom electrode has a T-shaped profile overlying the via dielectric layer and protruding through the via dielectric layer to the wire. In some embodiments, an atomic percentage of a metal element in the top electrode is about 50%, wherein an atomic percentage of nitrogen in the top electrode is about 50%.

In some embodiments, the present disclosure provides a method including: depositing a bottom electrode layer over and electrically coupled to a conductive wire; depositing a dielectric layer over the bottom electrode layer; depositing a metal layer over the dielectric layer; depositing a conductive barrier layer over the metal layer; depositing a top electrode layer over the conductive barrier layer, wherein the top electrode layer includes a metal element and a non-metal element, wherein the depositing of the top electrode layer exposes the conductive barrier layer to a gas including the non-metal element, and wherein the conductive barrier layer blocks diffusion of the non-metal element from the gas to the metal layer; and patterning the bottom and top electrode layers, the dielectric layer, the conductive barrier layer, and the metal layer to form a memory cell. In some embodiments, the top electrode layer, the conductive barrier layer, and the metal layer are deposited in situ in the same multi-chamber process tool. In some embodiments, the conductive barrier layer and the top electrode layer are deposited together by PVD using a common metal target and a common process chamber. In some embodiments, the gas is absent from the common process chamber during the depositing of the conductive barrier layer and is subsequently added to the common process chamber during the depositing of the top electrode layer. In some embodiments, the method further includes applying a forming voltage across the memory cell, wherein the applying results in a migration of metal cations from the metal layer to the dielectric layer and further results in formation of a metal filament in the dielectric layer from the metal cations. In some embodiments, the method further includes: depositing a second dielectric layer covering the conductive wire; and patterning the second dielectric layer to form an opening overlying and exposing the conductive wire, wherein the bottom and top electrode layers, the dielectric layer, the conductive barrier layer, and the metal layer are deposited covering the second dielectric layer and lining the opening, and wherein the patterning of the bottom and top electrode layers, the dielectric layer, the conductive barrier layer, and the metal layer includes a planarization into the bottom and top electrode layers and the conductive barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random-access memory (RRAM) cell comprising:
   a bottom electrode;
   a switching layer over the bottom electrode;
   an active metal layer over the switching layer;
   a top electrode over the active metal layer, wherein the top electrode comprises a metal element and a non-metal element, and wherein the top electrode depends on more energy to react with oxygen than the active metal layer; and
   a barrier layer between the top electrode and the active metal layer, wherein the barrier layer is conductive and is configured to block diffusion of the non-metal element from the top electrode to the active metal layer;
   wherein a width of the barrier layer is greater than that of the top electrode, and wherein the barrier layer directly contacts the active metal layer and the top electrode.

2. The RRAM cell according to claim 1, wherein the barrier layer consists essentially of the metal element.

3. The RRAM cell according to claim 1, wherein the non-metal element is nitrogen.

4. The RRAM cell according to claim 1, wherein the top electrode comprises titanium nitride, tantalum nitride, or tungsten nitride, the active metal layer comprises aluminum, and the barrier layer consists essentially of titanium, tantalum, or tungsten.

5. The RRAM cell according to claim 1, wherein a thickness of the barrier layer is between 50-100 angstroms.

6. The RRAM cell according to claim 1, wherein a ratio of atoms of the metal element in the top electrode and atoms of the non-metal element in the top electrode is 1:1 to 1:1.1.

7. The RRAM cell according to claim 1, wherein the active metal layer comprises a majority element, and wherein the RRAM cell further comprises:
   a conductive filament in the switching layer, wherein the conductive filament consists essentially of the majority element.

8. An integrated chip comprising:
   a substrate; and
   a memory cell over the substrate and comprising:
      a bottom electrode;
      a solid electrolyte layer over the bottom electrode;
      a metal layer over the solid electrolyte layer and configured to electrochemically dissolve in the solid electrolyte layer;
      a top electrode over the metal layer and comprising a metal nitride; and
      a barrier layer between and directly contacting the top electrode and the metal layer, wherein the barrier layer comprises titanium, tantalum, or tungsten, and wherein the barrier layer is substantially devoid of nitrogen along a bottom of the barrier layer;
      wherein a width of the barrier layer is less than a width of the metal layer.

9. The integrated chip according to claim 8, wherein the barrier layer has a U-shaped profile.

10. The integrated chip according to claim 8, wherein an atomic percentage of a metal element in the top electrode is 50%, and wherein an atomic percentage of nitrogen in the top electrode is 50%.

11. A method comprising:
    depositing a bottom electrode layer over and electrically coupled to a conductive wire;
    depositing a dielectric layer over the bottom electrode layer;
    depositing a metal layer over the dielectric layer;
    depositing a conductive barrier layer over the metal layer;
    depositing a top electrode layer over the conductive barrier layer, wherein the top electrode layer comprises a metal element and a non-metal element, wherein the depositing of the top electrode layer exposes the conductive barrier layer to a gas comprising the non-metal element, and wherein the conductive barrier layer blocks diffusion of the non-metal element from the gas to the metal layer; and
    patterning the bottom and top electrode layers, the dielectric layer, the conductive barrier layer, and the metal layer to form a memory cell;
    depositing a second dielectric layer covering the conductive wire; and
    patterning the second dielectric layer to form an opening overlying and exposing the conductive wire, wherein the bottom and top electrode layers, the dielectric layer, the conductive barrier layer, and the metal layer are deposited covering the second dielectric layer and lining the opening, and wherein the patterning of the bottom and top electrode layers, the dielectric layer, the conductive barrier layer, and the metal layer comprises a planarization into the bottom and top electrode layers and the conductive barrier layer.

12. The method according to claim 11, wherein the top electrode layer, the conductive barrier layer, and the metal layer are deposited in situ in the same multi-chamber process tool.

13. The method according to claim 11, wherein the conductive barrier layer and the top electrode layer are deposited together by physical vapor deposition (PVD) using a common metal target and a common process chamber.

14. The method according to claim 13, wherein the gas is absent from the common process chamber during the depositing of the conductive barrier layer and is subsequently added to the common process chamber during the depositing of the top electrode layer.

15. The method according to claim 11, further comprising:
   applying a forming voltage across the memory cell, wherein the applying results in a migration of metal cations from the metal layer to the dielectric layer and further results in formation of a metal filament in the dielectric layer from the metal cations.

16. The RRAM cell according to claim 1, wherein the barrier layer has a pair of sidewalls respectively on opposite sides of the barrier layer, wherein the active metal layer has a pair of sidewalls respectively on the opposite sides, and wherein the sidewalls of the barrier layer are between and laterally offset from the sidewalls of the active metal layer.

17. The RRAM cell according to claim 1, wherein the barrier layer is amorphous.

18. The RRAM cell according to claim 1, wherein the barrier layer is equiaxed crystalline.

19. The integrated chip according to claim 8, wherein a thickness of the barrier layer is between 50-100 angstroms.

20. The method according to claim 11, wherein a thickness of the conductive barrier layer is between 50-100 angstroms.

* * * * *